US012726165B2

(12) United States Patent
Goto et al.

(10) Patent No.: US 12,726,165 B2
(45) Date of Patent: Sep. 1, 2026

(54) METHOD OF MAKING ACOUSTIC WAVE DEVICES WITH MULTI-LAYER PIEZOELECTRIC SUBSTRATE

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 972 days.

(21) Appl. No.: 17/938,433

(22) Filed: Oct. 6, 2022

(65) Prior Publication Data

US 2023/0111032 A1 Apr. 13, 2023

Related U.S. Application Data

(60) Provisional application No. 63/262,276, filed on Oct. 8, 2021, provisional application No. 63/262,274, filed on Oct. 8, 2021.

(51) Int. Cl.
*H03H 3/02* (2006.01)
*H03H 9/02* (2006.01)
(Continued)

(52) U.S. Cl.
CPC .......... *H03H 3/02* (2013.01); *H03H 9/02574* (2013.01); *H03H 9/145* (2013.01); (Continued)

(58) Field of Classification Search
CPC ............... H03H 3/02; H03H 2003/028; H03H 9/02574; H03H 9/145; H03H 9/25; (Continued)

(56) References Cited

U.S. PATENT DOCUMENTS

| | | | |
|---|---|---|---|
| 3,786,373 A | 1/1974 | Schulz et al. | |
| 3,983,515 A | 9/1976 | Mitchell et al. | |

(Continued)

FOREIGN PATENT DOCUMENTS

| | | | |
|---|---|---|---|
| CN | 114497114 A | | 5/2022 |
| JP | 2006101092 A | * | 4/2006 |

(Continued)

OTHER PUBLICATIONS

Machine Translation of Japanese Patent Publication, JP 2006-101092, Oct. 2025 (Year: 2025).*

(Continued)

*Primary Examiner* — A. Dexter Tugbang
(74) *Attorney, Agent, or Firm* — VIA LLP

(57) ABSTRACT

A method of making an acoustic wave device includes forming or providing a substrate, forming or providing a functional layer over at least a portion of the substrate, forming or providing a piezoelectric layer over at least a portion of the functional layer, and forming or providing an interdigital transducer electrode over the piezoelectric layer. Forming or providing the piezoelectric layer includes removing a portion of the piezoelectric layer so that the piezoelectric layer has an outer edge spaced inward of an outer edge of the substrate, and so that the outer edge of the piezoelectric layer is tapered at an angle relative to a surface of the substrate to thereby reduce an acoustic reflection magnitude at said outer edge of the piezoelectric layer.

20 Claims, 16 Drawing Sheets

(51) Int. Cl.

| | |
|---|---|
| ***H03H 9/145*** | (2006.01) |
| ***H03H 9/25*** | (2006.01) |
| ***H03H 9/56*** | (2006.01) |
| ***H10N 30/067*** | (2023.01) |
| ***H10N 30/50*** | (2023.01) |
| ***H10N 30/853*** | (2023.01) |
| *H04B 1/40* | (2015.01) |

(52) U.S. Cl.

CPC .............. *H03H 9/25* (2013.01); *H03H 9/568* (2013.01); *H10N 30/067* (2023.02); *H10N 30/50* (2023.02); *H10N 30/853* (2023.02); *H03H 2003/028* (2013.01); *H03H 9/0211* (2013.01); *H03H 9/02559* (2013.01); *H03H 9/02677* (2013.01); *H04B 1/40* (2013.01); *Y10T 29/42* (2015.01)

(58) Field of Classification Search

CPC ............... H03H 9/568; H03H 9/02559; H03H 9/02677; H03H 9/132; H03H 9/0211; H10N 30/067; H10N 30/50; H10N 30/853; H04B 1/40; Y10T 29/42

See application file for complete search history.

(56) References Cited

U.S. PATENT DOCUMENTS

| | | | | |
|---|---|---|---|---|
| 4,097,825 | A | 6/1978 | Gerard | |
| 4,204,178 | A | 5/1980 | Mitchell | |
| 4,634,914 | A | 1/1987 | Ballato | |
| 4,773,138 | A | 9/1988 | Ballato et al. | |
| 4,996,165 | A | 2/1991 | Chang et al. | |
| 5,113,115 | A | 5/1992 | Mariani | |
| 5,163,435 | A | 11/1992 | Soldner et al. | |
| 5,245,734 | A | 9/1993 | Issartel | |
| 5,508,667 | A | 4/1996 | Kondratiev et al. | |
| 5,646,584 | A | 7/1997 | Kondratyev et al. | |
| 5,895,996 | A | 4/1999 | Takagi et al. | |
| 5,952,899 | A | 9/1999 | Kadota et al. | |
| 6,046,524 | A | 4/2000 | Yamanouchi et al. | |
| 6,262,513 | B1 | 7/2001 | Furukawa et al. | |
| 6,426,583 | B1 | 7/2002 | Onishi et al. | |
| 6,608,363 | B1 | 8/2003 | Fazelpour | |
| 6,637,087 | B1 | 10/2003 | Horiuchi et al. | |
| 7,202,590 | B2 | 4/2007 | Matsuda et al. | |
| 7,230,512 | B1 | 6/2007 | Carpenter et al. | |
| 7,733,196 | B2 | 6/2010 | Tsurunari et al. | |
| 8,174,339 | B2 | 5/2012 | Matsuda et al. | |
| 8,228,137 | B2 | 7/2012 | Inoue et al. | |
| 8,378,760 | B2 | 2/2013 | Iwaki et al. | |
| 8,482,184 | B2 | 7/2013 | Goto et al. | |
| 8,836,111 | B2 | 9/2014 | Conti et al. | |
| 9,002,038 | B2 | 4/2015 | Ochs et al. | |
| 9,118,303 | B2 | 8/2015 | Inoue | |
| 9,219,467 | B2 | 12/2015 | Inoue et al. | |
| 9,246,533 | B2 | 1/2016 | Fujiwara et al. | |
| 9,337,354 | B2 | 5/2016 | Protheroe et al. | |
| 9,438,201 | B2 | 9/2016 | Hori et al. | |
| 9,484,886 | B2 | 11/2016 | Takemura | |
| 9,520,857 | B2 | 12/2016 | Fujiwara et al. | |
| 9,570,668 | B2 | 2/2017 | Iwamoto | |
| 9,722,573 | B2 | 8/2017 | Fujiwara et al. | |
| 9,822,001 | B2 | 11/2017 | Gritti et al. | |
| 10,135,422 | B2 | 11/2018 | Goto et al. | |
| 10,153,909 | B2 | 12/2018 | Horvth et al. | |
| 10,243,536 | B2 | 3/2019 | Saijo et al. | |
| 10,483,942 | B2 | 11/2019 | Goto et al. | |
| 11,050,406 | B2 | 6/2021 | Maki et al. | |
| 11,133,789 | B2 | 9/2021 | Maki et al. | |
| 11,222,855 | B2 | 1/2022 | Yota et al. | |
| 11,309,864 | B2 | 4/2022 | Ibaragi et al. | |
| 11,368,137 | B2 | 6/2022 | Goto et al. | |
| 11,387,193 | B2 | 7/2022 | Yota et al. | |
| 11,431,319 | B2 | 8/2022 | Goto | |
| 11,463,065 | B2 | 10/2022 | Goto | |
| 11,489,513 | B2 | 11/2022 | Goto | |
| 11,552,614 | B2 | 1/2023 | Caron et al. | |
| 11,616,487 | B2 | 3/2023 | Nakamura et al. | |
| 11,616,491 | B2 | 3/2023 | Tang et al. | |
| 11,621,690 | B2 | 4/2023 | Fukuhara et al. | |
| 11,658,688 | B2 | 5/2023 | Abbott et al. | |
| 11,664,780 | B2 | 5/2023 | Goto et al. | |
| 11,671,072 | B2 | 6/2023 | Goto et al. | |
| 11,677,377 | B2 | 6/2023 | Goto et al. | |
| 11,689,178 | B2 | 6/2023 | Nakamura et al. | |
| 11,722,122 | B2 | 8/2023 | Goto et al. | |
| 11,750,172 | B2 | 9/2023 | Goto et al. | |
| 11,830,826 | B2 | 11/2023 | Yota et al. | |
| 11,843,366 | B2 | 12/2023 | Fukuhara et al. | |
| 11,881,837 | B2 | 1/2024 | Caron et al. | |
| 11,923,822 | B2 | 3/2024 | Maki et al. | |
| 12,009,795 | B2 | 6/2024 | Abbott et al. | |
| 12,047,053 | B2 | 7/2024 | Maki et al. | |
| 12,063,027 | B2 | 8/2024 | Goto et al. | |
| 12,166,463 | B2 | 12/2024 | Goto et al. | |
| 12,368,430 | B2 | 7/2025 | Goto et al. | |
| 12,431,857 | B2 | 9/2025 | Goto et al. | |
| 12,451,866 | B2 * | 10/2025 | Goto | H03H 3/02 |
| 2002/0158707 | A1 | 10/2002 | Noguchi | |
| 2002/0163402 | A1 | 11/2002 | Tsuzuki et al. | |
| 2003/0011577 | A1 | 1/2003 | Katsuki et al. | |
| 2004/0007079 | A1 | 1/2004 | Wilda | |
| 2004/0196119 | A1 | 10/2004 | Shibahara et al. | |
| 2004/0232802 | A1 | 11/2004 | Koshido | |
| 2006/0197630 | A1 | 9/2006 | Fuse | |
| 2007/0044296 | A1 | 3/2007 | Jeon et al. | |
| 2007/0080612 | A1 | 4/2007 | Terazono et al. | |
| 2008/0174389 | A1 * | 7/2008 | Mori | H03H 9/132 310/334 |
| 2008/0197941 | A1 * | 8/2008 | Suzuki | H03H 9/568 333/189 |
| 2011/0084382 | A1 | 4/2011 | Chen et al. | |
| 2011/0156837 | A1 | 6/2011 | Inoue et al. | |
| 2011/0254639 | A1 | 10/2011 | Tsutsumi et al. | |
| 2014/0009032 | A1 | 1/2014 | Takahashi et al. | |
| 2014/0339957 | A1 | 11/2014 | Tajima et al. | |
| 2016/0028373 | A1 | 1/2016 | Costa et al. | |
| 2016/0172573 | A1 | 6/2016 | Iwaki et al. | |
| 2016/0226464 | A1 | 8/2016 | Fujiwara et al. | |
| 2016/0268997 | A1 | 9/2016 | Komatsu et al. | |
| 2016/0277003 | A1 | 9/2016 | Kikuchi et al. | |
| 2017/0063332 | A1 | 3/2017 | Gilbert et al. | |
| 2017/0214386 | A1 | 7/2017 | Kido | |
| 2017/0222618 | A1 | 8/2017 | Inoue et al. | |
| 2017/0250669 | A1 | 8/2017 | Kuroyanagi et al. | |
| 2017/0272051 | A1 | 9/2017 | Kurihara et al. | |
| 2017/0273183 | A1 | 9/2017 | Kawasaki et al. | |
| 2017/0288627 | A1 | 10/2017 | Takano et al. | |
| 2017/0288629 | A1 | 10/2017 | Bhattacharjee et al. | |
| 2017/0331456 | A1 | 11/2017 | Ono | |
| 2017/0359048 | A1 | 12/2017 | Yasuda | |
| 2017/0373241 | A1 | 12/2017 | Kimura | |
| 2018/0013404 | A1 | 1/2018 | Kawasaki et al. | |
| 2018/0069529 | A1 | 3/2018 | Bi et al. | |
| 2018/0152169 | A1 | 5/2018 | Goto et al. | |
| 2018/0152191 | A1 | 5/2018 | Niwa et al. | |
| 2018/0316329 | A1 | 11/2018 | Guenard et al. | |
| 2018/0358406 | A1 * | 12/2018 | Block | H03H 3/02 |
| 2018/0367119 | A1 | 12/2018 | Lee | |
| 2019/0074819 | A1 | 3/2019 | Goto et al. | |
| 2019/0089334 | A1 * | 3/2019 | Koyanagi | H03H 9/02574 |
| 2019/0238114 | A1 | 8/2019 | Kishimoto et al. | |
| 2019/0288661 | A1 | 9/2019 | Akiyama et al. | |
| 2019/0379347 | A1 | 12/2019 | Goto et al. | |
| 2020/0076402 | A1 | 3/2020 | Koo et al. | |
| 2020/0212884 | A1 | 7/2020 | Shin et al. | |
| 2020/0228093 | A1 | 7/2020 | Daimon | |
| 2020/0313646 | A1 | 10/2020 | Caron | |
| 2020/0321937 | A1 | 10/2020 | Kishi et al. | |
| 2020/0366270 | A1 | 11/2020 | Matsuoka | |
| 2021/0020587 | A1 | 1/2021 | Yota et al. | |
| 2021/0036209 | A1 | 2/2021 | Osawa et al. | |
| 2021/0050842 | A1 | 2/2021 | Tang et al. | |

(56) References Cited

U.S. PATENT DOCUMENTS

| | | | |
|---|---|---|---|
| 2021/0111688 | A1 | 4/2021 | Abbott et al. |
| 2021/0111697 | A1 | 4/2021 | Daimon et al. |
| 2021/0118821 | A1 | 4/2021 | Yota et al. |
| 2021/0119650 | A1 | 4/2021 | Abbott et al. |
| 2021/0159876 | A1 | 5/2021 | Maki et al. |
| 2021/0218381 | A1 | 7/2021 | Luo et al. |
| 2021/0265970 | A1 | 8/2021 | Yamaji et al. |
| 2022/0014175 | A1 | 1/2022 | Nagatomo et al. |
| 2022/0077840 | A1 | 3/2022 | Caron |
| 2022/0103146 | A1 | 3/2022 | Wang |
| 2022/0140814 | A1 | 5/2022 | Dyer et al. |
| 2022/0158610 | A1 | 5/2022 | Goto et al. |
| 2022/0158611 | A1 | 5/2022 | Potratz et al. |
| 2022/0158612 | A1 | 5/2022 | Goto et al. |
| 2022/0209738 | A1 | 6/2022 | Torazawa et al. |
| 2022/0271734 | A1 | 8/2022 | Abbott et al. |
| 2022/0321096 | A1 | 10/2022 | Goto et al. |
| 2022/0329227 | A1 | 10/2022 | Goto et al. |
| 2022/0399867 | A1 | 12/2022 | Goto et al. |
| 2022/0399871 | A1 | 12/2022 | Goto et al. |
| 2023/0006125 | A1 | 1/2023 | Goto et al. |
| 2023/0013597 | A1 | 1/2023 | Goto et al. |
| 2023/0016884 | A1 | 1/2023 | Goto et al. |
| 2023/0028925 | A1 | 1/2023 | Kobayashi |
| 2023/0031568 | A1 | 2/2023 | Tang et al. |
| 2023/0036775 | A1 | 2/2023 | Goto et al. |
| 2023/0054636 | A1 | 2/2023 | Dutta et al. |
| 2023/0055758 | A1 | 2/2023 | Goto et al. |
| 2023/0062981 | A1 | 3/2023 | Fukuhara et al. |
| 2023/0069327 | A1 | 3/2023 | Fukuhara et al. |
| 2023/0070350 | A1 | 3/2023 | Rei |
| 2023/0101228 | A1 | 3/2023 | Brunner et al. |
| 2023/0104405 | A1 | 4/2023 | Hiramatsu et al. |
| 2023/0107376 | A1 | 4/2023 | Goto et al. |
| 2023/0107820 | A1 | 4/2023 | Fukuhara et al. |
| 2023/0108686 | A1 | 4/2023 | Fukuhara et al. |
| 2023/0109106 | A1 | 4/2023 | Hiramatsu et al. |
| 2023/0110477 | A1 | 4/2023 | Maki et al. |
| 2023/0111849 | A1 | 4/2023 | Maki et al. |
| 2023/0113099 | A1 | 4/2023 | Goto et al. |
| 2023/0117464 | A1 | 4/2023 | Goto et al. |
| 2023/0118194 | A1 | 4/2023 | Goto et al. |
| 2023/0119788 | A1 | 4/2023 | Goto et al. |
| 2023/0123285 | A1 | 4/2023 | Goto et al. |
| 2023/0163748 | A1 | 5/2023 | Goto et al. |
| 2023/0208376 | A1 | 6/2023 | Goto et al. |
| 2023/0208384 | A1 | 6/2023 | Goto et al. |
| 2023/0208389 | A1 | 6/2023 | Goto et al. |
| 2023/0208398 | A1 | 6/2023 | Goto et al. |
| 2023/0208399 | A1 | 6/2023 | Goto et al. |
| 2023/0223910 | A1 | 7/2023 | Goto et al. |
| 2023/0223917 | A1 | 7/2023 | Goto et al. |
| 2023/0223919 | A1 | 7/2023 | Goto et al. |
| 2023/0225212 | A1 | 7/2023 | Goto et al. |
| 2023/0291385 | A1 | 9/2023 | Okamoto et al. |
| 2023/0327645 | A1 | 10/2023 | Goto et al. |
| 2023/0336145 | A1 | 10/2023 | Goto et al. |
| 2023/0336147 | A1 | 10/2023 | Feld et al. |
| 2023/0336153 | A1 | 10/2023 | Goto et al. |
| 2023/0344403 | A1 | 10/2023 | Goto et al. |
| 2023/0344410 | A1 | 10/2023 | Goto et al. |
| 2023/0344416 | A1 | 10/2023 | Chen et al. |
| 2023/0361755 | A1 | 11/2023 | Goto |
| 2023/0370044 | A1 | 11/2023 | Goto et al. |
| 2023/0378937 | A1 | 11/2023 | Goto et al. |
| 2023/0396233 | A1 | 12/2023 | Nakamura et al. |
| 2023/0403939 | A1 | 12/2023 | Goto et al. |
| 2024/0007079 | A1 | 1/2024 | Goto et al. |
| 2024/0039507 | A1 | 2/2024 | Goto et al. |
| 2024/0039516 | A1 | 2/2024 | Goto et al. |
| 2024/0048125 | A1 | 2/2024 | Goto et al. |
| 2024/0063773 | A1 | 2/2024 | Fukuhara et al. |
| 2024/0088870 | A1 | 3/2024 | Goto et al. |
| 2024/0178812 | A1 | 5/2024 | Goto et al. |
| 2024/0178814 | A1 | 5/2024 | Goto et al. |

FOREIGN PATENT DOCUMENTS

| | | | |
|---|---|---|---|
| WO | 2015/098679 | A1 | 7/2015 |
| WO | 2020/098481 | A1 | 5/2020 |
| WO | 2022/022264 | A1 | 2/2022 |
| WO | 2022/163409 | A1 | 8/2022 |

OTHER PUBLICATIONS

Yantchev et al, "Micromachined thin film plate acoustic resonators utilizing the lowest order symmetric lamb wave mode," in IEEE Transactions on Ultrasonics, Ferroelectrics, and Frequency Control, vol. 54, No. 1, pp. 87-95, Jan. 2007. (Year: 2007).*

Lee et al., "A cost-effective MEMS cavity packaging technology for mass production", IEEE Trans. Adv. Packaging, vol. 32(2):453-480 (2009).

* cited by examiner

METHOD OF MAKING ACOUSTIC WAVE DEVICES WITH MULTI-LAYER PIEZOELECTRIC SUBSTRATE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

The packaging process for multilayer piezoelectric substrate packages can apply stresses to the piezoelectric layer (e.g., during heat cycle testing) that can result in reliability issues including cracking of the piezoelectric layer.

SUMMARY

Accordingly, there is a need for a surface acoustic wave (e.g., SAW or TCSAW) package with improved reliability that can withstand the stresses (e.g., from heat cycle testing) during the packaging process while reducing acoustic reflection in the piezoelectric layer.

In accordance with one aspect of the disclosure, a surface acoustic wave device has a piezoelectric layer over a substrate. The outer boundary of the piezoelectric layer is removed (e.g., etched) so that a resulting outer edge of the piezoelectric layer is spaced inward of an outer edge of the substrate and tapered at an angle that reduces acoustic reflection.

In accordance with one aspect of the disclosure, a method of making a surface acoustic wave device includes bonding a piezoelectric layer over a substrate. The method also includes removing (e.g., etching) an outer boundary of the piezoelectric layer so that a resulting outer edge of the piezoelectric layer is spaced inward of an outer edge of the substrate and tapered at an angle that reduces acoustic reflection.

In accordance with one aspect of the disclosure, an acoustic wave device is provided. The acoustic wave device comprises a substrate, a functional layer disposed over at least a portion of the substrate, a piezoelectric layer disposed over at least a portion of the functional layer, and an interdigital transducer electrode disposed on the piezoelectric layer. The piezoelectric layer has an outer edge spaced inward of an outer edge of the substrate, the outer edge of the piezoelectric layer being tapered at an angle relative to a surface of the substrate to thereby reduce an acoustic reflection magnitude at said outer edge of the piezoelectric layer.

In accordance with another aspect of the disclosure, a radio frequency module is provided. The radio frequency module comprises a package substrate. The radio frequency module also comprises an acoustic wave device including a substrate, a functional layer disposed over at least a portion of the substrate, a piezoelectric layer disposed over at least a portion of the functional layer, and an interdigital transducer electrode disposed on the piezoelectric layer. The piezoelectric layer has an outer edge spaced inward of an outer edge of the substrate, the outer edge of the piezoelectric layer being tapered at an angle relative to a surface of the substrate to thereby reduce an acoustic reflection magnitude at said outer edge of the piezoelectric layer. The radio frequency module also comprises additional circuitry, the packaged acoustic wave component and additional circuitry disposed on the package substrate.

In accordance with another aspect of the disclosure, a wireless communication device is provided. The wireless communication device comprises an antenna and a front end module including one or more acoustic wave devices configured to filter a radio frequency signal associated with the antenna. Each acoustic wave device includes a substrate, a functional layer disposed over at least a portion of the substrate, a piezoelectric layer disposed over at least a portion of the functional layer, and an interdigital transducer electrode disposed on the piezoelectric layer. The piezoelectric layer has an outer edge spaced inward of an outer edge of the substrate, the outer edge of the piezoelectric layer being tapered at an angle relative to a surface of the substrate to thereby reduce an acoustic reflection magnitude at said outer edge of the piezoelectric layer.

In accordance with another aspect of the disclosure, a method of making an acoustic wave device is provided. The method comprises forming or providing a substrate, forming or providing a functional layer over at least a portion of the substrate, forming or providing a piezoelectric layer over at least a portion of the functional layer, and forming or providing an interdigital transducer electrode over the piezoelectric layer. Forming or providing the piezoelectric layer includes removing a portion of the piezoelectric layer so that the piezoelectric layer has an outer edge spaced inward of an outer edge of the substrate, and so that the outer edge of the piezoelectric layer is tapered at an angle relative to a surface of the substrate to thereby reduce an acoustic reflection magnitude at said outer edge of the piezoelectric layer.

In accordance with another aspect of the disclosure, a method of making a radio frequency module is provided. The method comprises forming or providing a package substrate. The method also comprises forming or providing an acoustic wave device including forming or providing a substrate, forming or providing a functional layer over at least a portion of the substrate, and forming or providing a piezoelectric layer over at least a portion of the functional layer. Forming or providing the piezoelectric layer includes a) removing a portion of the piezoelectric layer so that the piezoelectric layer has an outer edge spaced inward of an outer edge of the substrate and b) tapering the outer edge of the piezoelectric layer at an angle relative to a surface of the substrate to thereby reduce an acoustic reflection magnitude at said outer edge of the piezoelectric layer, and forming or providing an interdigital transducer electrode over the piezoelectric layer. The method also comprises attaching additional circuitry and the packaged acoustic wave component to the package substrate.

BRIEF DESCRIPTION OF THE DRAWINGS

Embodiments of this disclosure will now be described, by way of non-limiting example, with reference to the accompanying drawings.

DETAILED DESCRIPTION

Figure 1:
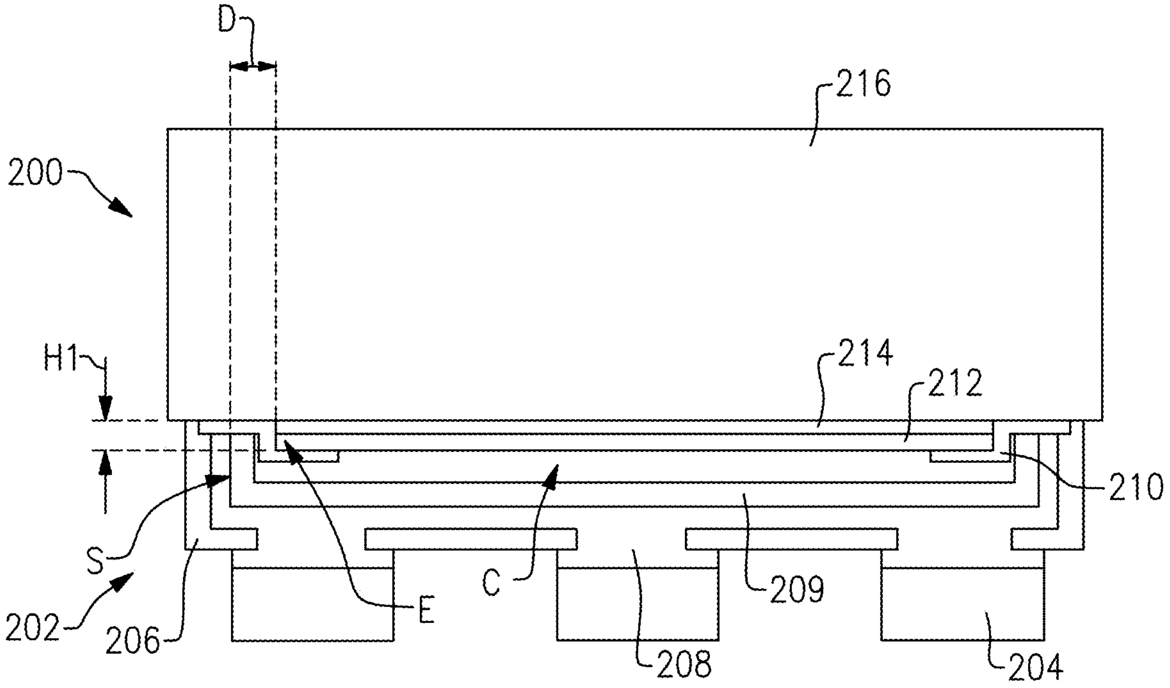
FIG. 1 illustrates a schematic cross-sectional side view of a multi-layer piezoelectric substrate (MPS) package structure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). Any features of the SAW resonators and/or devices discussed herein can be implemented in any suitable SAW device.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Multi-layer piezoelectric substrate (MPS) SAW resonators can thermally insulate an interdigital transducer electrode and a piezoelectric layer. By reducing dissipative thermal impedance of the SAW device, the ruggedness and power handling can be improved.

Some MPS SAW resonators have achieved high Q by confining energy and good thermal dissipation using a silicon (Si) support layer. However, such approaches have encountered technical challenges related to undesirable higher frequency spurious responses.

Some other MPS SAW resonators have achieved high Q by confining energy and have also reduced higher frequency spurious responses. However, such approaches have encountered relatively low thermal heat dissipation.

Aspects of the present disclosure relate to SAW resonators that include a support substrate or layer (e.g., a single crystal supporting substrate), a functional layer (e.g., a dielectric layer) over the support substrate or layer, a piezoelectric layer (e.g., a lithium niobate (LN or LiNbO3) layer or a lithium tantalate (LT or LiTaO3) layer) over the functional layer, and an interdigital transducer (IDT) electrode over the piezoelectric layer. Such SAW resonators can also include a temperature compensation layer (e.g., silicon dioxide ($SiO_2$) layer) over the IDT electrode in certain embodiments. The SAW resonators can also include an adhesion layer disposed between the support substrate and the functional layer and/or an adhesion layer between the functional layer and the piezoelectric layer, in certain applications.

SAW resonators with the functional layer and the support layer or substrate can beneficially provide a relatively high effective electromechanical coupling coefficient ($k^2$), a relatively high quality factor (Q), a relatively high power durability and thermal dissipation, and reduced high frequency spurious responses. The high coupling coefficient ($k^2$) can be beneficial for relatively wide bandwidth filters. The high quality factor (Q) can beneficially lead to a relatively low insertion loss. The reduced high frequency spurious may make the SAW resonators compatible with multiplexing with higher frequency bands.

In an embodiment, an MPS SAW resonator includes a piezoelectric layer over a functional layer over a silicon support substrate or layer. The silicon support substrate can reduce thermal impedance of the MPS SAW resonator. The functional layer can be a single crystal layer arranged to confine acoustic energy and lower a higher frequency spurious response. The piezoelectric layer, the functional layer, and the silicon support substrate can all be single crystal layers.

Embodiments of MPS SAW resonators (e.g., packages) will now be discussed. Any suitable principles and advantages of these MPS SAW resonators can be implemented together with each other in an MPS SAW resonator and/or in an acoustic wave filter. MPS SAW resonators (e.g., packages) disclosed herein can have lower loss than certain bulk acoustic wave devices.

FIG. 1 illustrates a packaged acoustic wave component 200 (e.g., a multi-layer piezoelectric substrate (MPS) package or structure). The component 200 has a substrate 216, an additional (e.g., functional, dielectric) structure or layer 214 disposed over (e.g., bonded to) the substrate 216, and a piezoelectric structure or layer 212 disposed over (e.g. bonded to) the dielectric layer 214. One or more signal lines 210 can be disposed on (e.g., connected to) the piezoelectric layer 212.

With continued reference to FIG. 1, a thermally conductive structure or package 202 is connected to the substrate 216, for example via the signal line(s) 210. The thermally conductive structure or package 202 includes a metal portion 208, a polyimide layer 209 disposed over at least a portion of the metal portion 208, where the metal portion 208 is shaped so a cavity C (e.g., open or hollow cavity, air cavity) exists between at least a portion of the polyimide layer 209 and at least a portion of the piezoelectric layer 212. The metal portion 208 can be made of copper (Cu). A dielectric overcoat 206 can be disposed over at least a portion of the metal portion 208. One or more solder connections 204 are disposed on the metal portion 208.

The substrate 216 can include (e.g., be made of, consist of) silicon (Si). In another example, the substrate 216 can be made of poly-silicon. In another example, the substrate 216 can be made of amorphous silicon. In another example, the substrate 216 can be made of silicon nitride (SiN). In another example, the substrate 216 can be made of Sapphire. In another example, the substrate 216 can be made of quartz. In another example, the substrate 216 can be made of aluminum nitride (AlN). In another example, the substrate 216 can be made of polycrystalline ceramic ($Mg_2O_4$). In another implementation, the substrate 216 can be made of diamond. However, the substrate 216 can be made of other suitable high impedance materials. An acoustic impedance of the substrate 216 can be higher than an acoustic impedance of the piezoelectric structure or layer 212.

The functional (e.g., temperature compensation, dielectric) structure or layer 214 can have a lower acoustic impedance than the substrate 216. The functional structure or layer 214 can increase adhesion between the substrate 216 and the piezoelectric structure or layer 212 of the component 200 (e.g., multi-layer piezoelectric substrate (MPS) package or structure). Alternatively or additionally, the functional structure or layer 214 can increase heat dissipation of the component 200. The functional structure or layer 214 can be made of silicon dioxide ($SiO_2$). In some implementations, the functional structure or layer is excluded from the component or package 200 (e.g., the piezoelectric layer 212 is disposed on, adjacent to or in contact with the substrate 216).

In one implementation, the piezoelectric layer 212 can be made of lithium niobate (LN or LiNbO3). In another implementation, the piezoelectric layer 212 can be made of lithium tantalate (LT or LiTaO3). Though not shown, one or more resonators (e.g., including an interdigital transducer (IDT) electrode, for example, between two reflectors) can be disposed on (e.g., attached or mounted to) the piezoelectric layer 212.

With continued reference to FIG. 1, the piezoelectric layer 212 (and dielectric layer 214) has an outer edge or perimeter E that is spaced from (e.g., spaced inward from) the metal portion 208 (e.g., from an inner surface S of the metal portion 208A) by a distance D. In one example, the distance D can be between 5 microns (0.005 mm) and 15 microns (0.015 mm), such as 5 microns, 10 microns and 15 microns.

The signal line(s) 210 can have a first portion adjacent (e.g., in contact with, attached to, bonded to) the substrate 216 and a second portion adjacent (e.g., in contact with, attached to, bonded to) the piezoelectric layer 212 (e.g., a surface of the piezoelectric layer 212), the first portion and second portion spaced from each other by a distance H1 (e.g., extend along parallel planes), and interconnected by a linear (e.g., vertical) portion, so that the signal line(s) 210 have a stepped configuration.

The outer edge E of the piezoelectric layer 212 and of the dielectric layer 214 being spaced from the metal portion 208 (e.g., from the inner surface S of the metal portion 208) advantageously inhibits (e.g. prevents) deformation and damage (e.g., cracks) to the piezoelectric layer 212 (and to the functional layer 214) due to stresses applied on the component 200, for example resulting from a different thermal expansion of the substrate 216 and the thermally conductive structure or package 202 (e.g., during heat cycle testing). Additionally, spacing the outer edge E of the piezoelectric layer 212 and of the functional layer 214 from the metal portion 208A can advantageously inhibit (e.g., prevent) damage to the resulting dies during dicing (e.g., with a mechanical saw) of the wafer, the dies including the substrate, dielectric and piezoelectric layers used for the component 200.

Figure 2A:
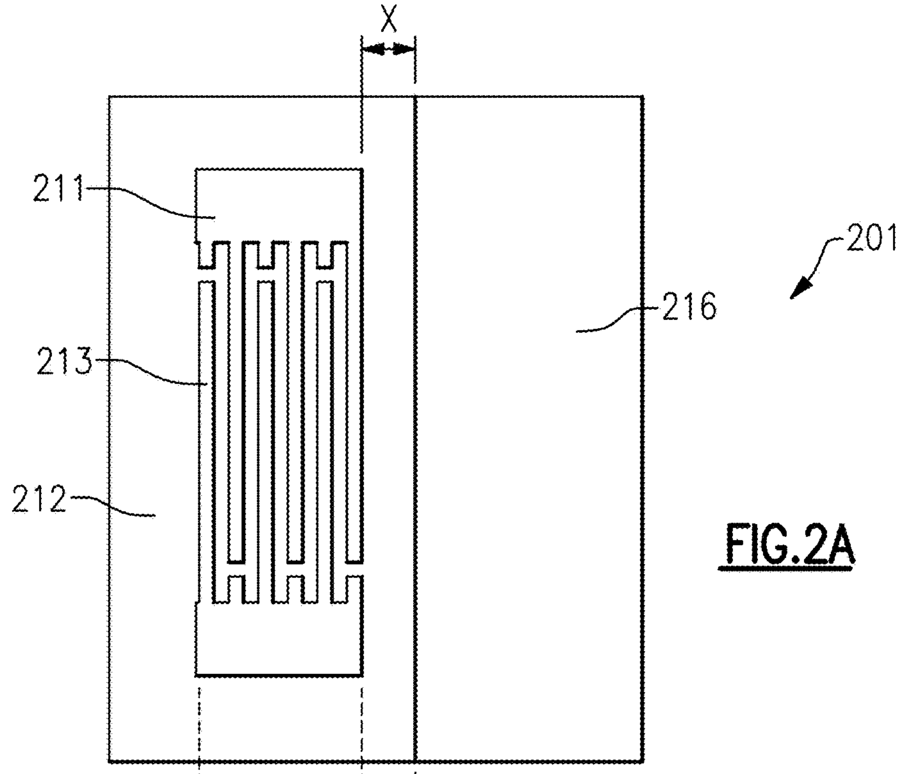
FIG. 2A illustrates a top view of an end portion of the multi-layer piezoelectric substrate (MPS) structure of FIG. 1.
Figure 2B:
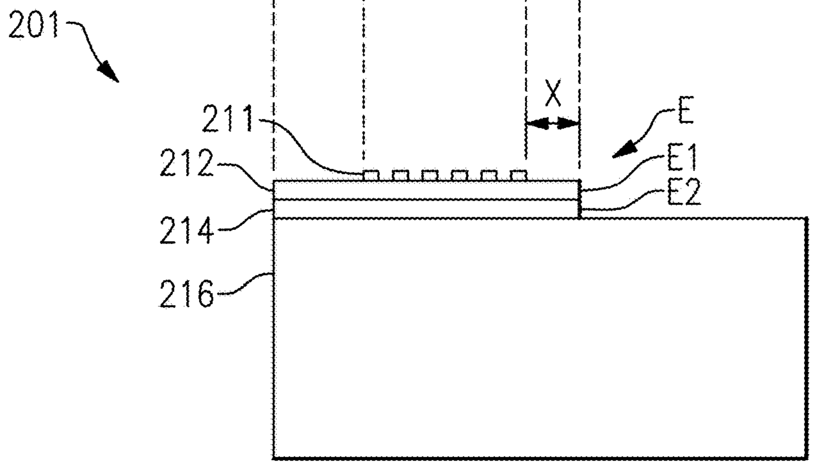
FIG. 2B illustrates a side view of the end portion of the multi-layer piezoelectric substrate (MPS) structure of FIG. 2A.

FIGS. 2A-2B show a partial top view and a side view of an end portion of a multi-layer piezoelectric substrate (MPS) 201 of the packaged acoustic wave component 200 (e.g., a multi-layer piezoelectric substrate (MPS) package or structure) of FIG. 1. An interdigital transducer (IDT) electrode 211 having a plurality of fingers 213 is disposed on the piezoelectric layer 212. The outer edge E includes an outer edge E1 of the piezoelectric layer 212 and an outer edge E2 of the functional (e.g., dielectric, temperature compensation) layer 214. The IDT electrode 211 is spaced from the outer edge E1 of the piezoelectric layer 212 by a distance X. The outer edge E1 or the piezoelectric layer 212 is aligned with the outer edge E2 of the functional layer 214. In the illustrated embodiment, the outer edge E (e.g., outer edge E1 of the piezoelectric layer and outer edge E2 of the functional layer 214) is perpendicular to a surface of the substrate 216 (e.g., vertical orientation when the substrate 216 extends horizontally).

Figure 2C:
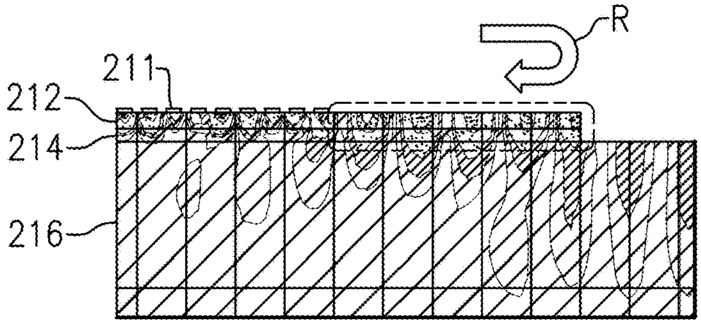
FIG. 2C shows an image of acoustic wave propagation through the multi-layer piezoelectric substrate (MPS) structure of FIG. 2A.

FIG. 2C shows an image of acoustic wave propagation through a multi-layer piezoelectric substrate (MPS) similar to the MPS 201 of FIGS. 2A-2B. FIG. 2C shows that having the outer edge E (e.g., outer edge E1 of the piezoelectric layer and outer edge E2 of the functional layer 214) perpendicular to a surface of the substrate 216 results in a large (e.g., strong) edge acoustic reflection R, which may affect (e.g., worsen) the performance of the MPS 201 in a filter (e.g., that includes the component 200).

Figure 3A:
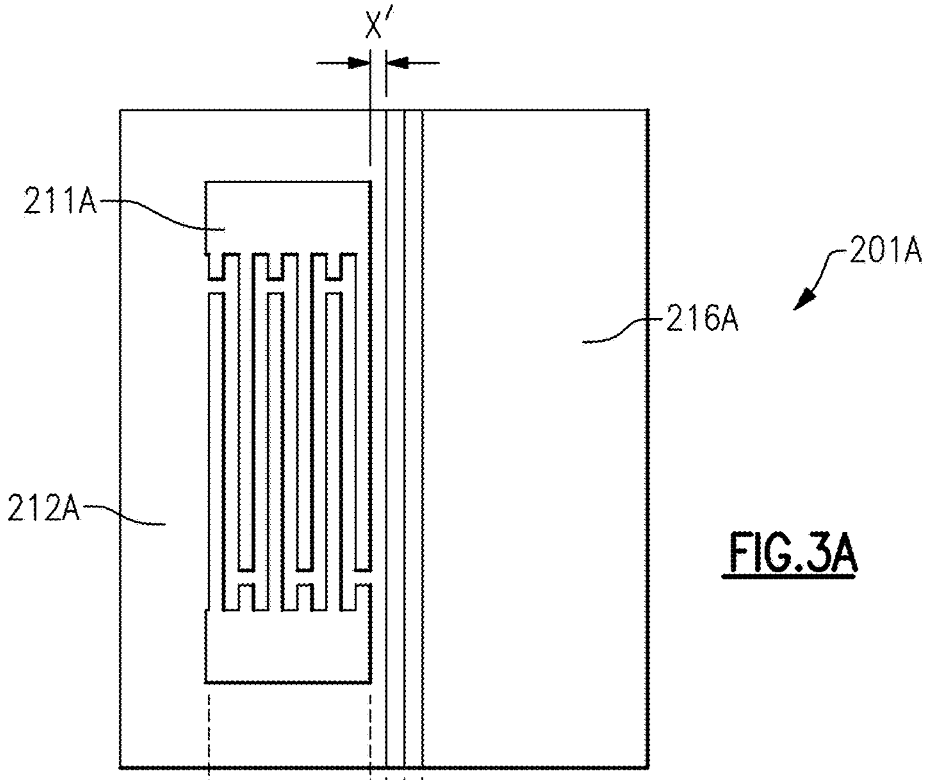
FIG. 3A illustrates a top view of an end portion of the multi-layer piezoelectric substrate (MPS).
Figure 3B:
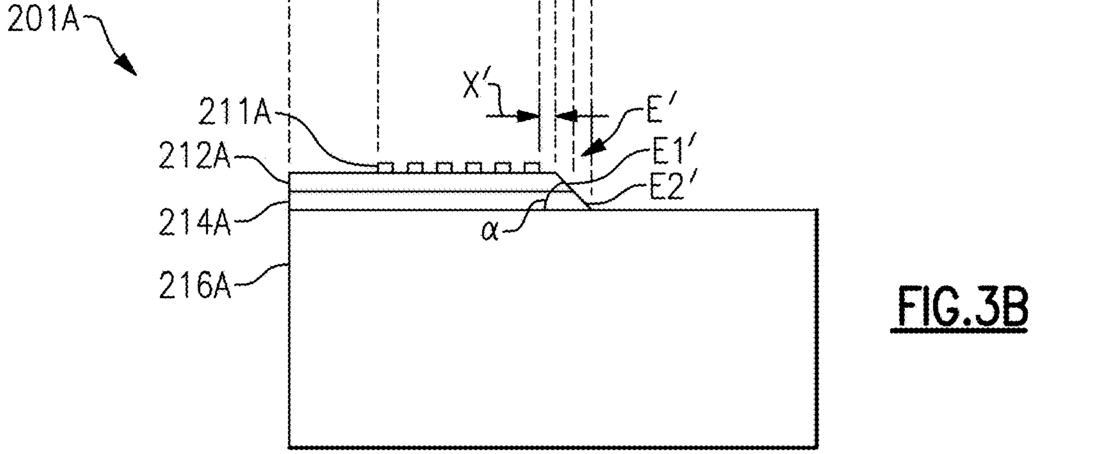
FIG. 3B illustrates a side view of the end portion of the multi-layer piezoelectric substrate (MPS) structure of FIG. 3A.

The inventors have recognized that altering the shape of the outer edge E1 of the piezoelectric layer 212 and/or the outer edge E2 of the functional layer E2 can reduce the edge acoustic reflection (e.g., acoustic reflection magnitude) for a packaged acoustic wave component, such as the component 200, (e.g., when incorporated into a filter). FIGS. 3A-3B show a partial top view and a side view of an end portion of a multi-layer piezoelectric substrate (MPS) 201A of a packaged acoustic wave component similar to the component 200 (e.g., a multi-layer piezoelectric substrate (MPS) package or structure). The multi-layer piezoelectric substrate (MPS) 201A is similar to the multi-layer piezoelectric substrate (MPS) 201 of FIGS. 2A-2B. Thus, reference numerals used to designate the various components of the multi-layer piezoelectric substrate (MPS) 201A are identical to those used for identifying the corresponding components of the multi-layer piezoelectric substrate (MPS) 201 in FIGS. 2A-2B, except that an "A" has been added to the numerical identifier. Therefore, the structure and description for the various features and components of the multi-layer piezoelectric substrate (MPS) 201 in FIGS. 2A-2B are understood to also apply to the corresponding features of the multi-layer piezoelectric substrate (MPS) 201A in FIGS. 3A-3B, except as described below.

The multi-layer piezoelectric substrate (MPS) 201A differs from the multi-layer piezoelectric substrate (MPS) 201 in that the outer edge E' (e.g., outer edge E1' of the piezoelectric layer 212A and outer edge E2' of the functional layer 214A) is tapered at an angle α (e.g., at a non-perpendicular angle, such as an acute angle) relative to the substrate 216A. The IDT 211A is spaced from the outer edge E1' of the piezoelectric layer 212A by a distance X'. The outer edge E1' of the piezoelectric layer 212A and the outer edge E2' of the functional layer 214A can be aligned so that they extend along the same plane along the angle a, and so that the functional layer 214A extends further outward than the piezoelectric layer 212A.

Figure 3C:
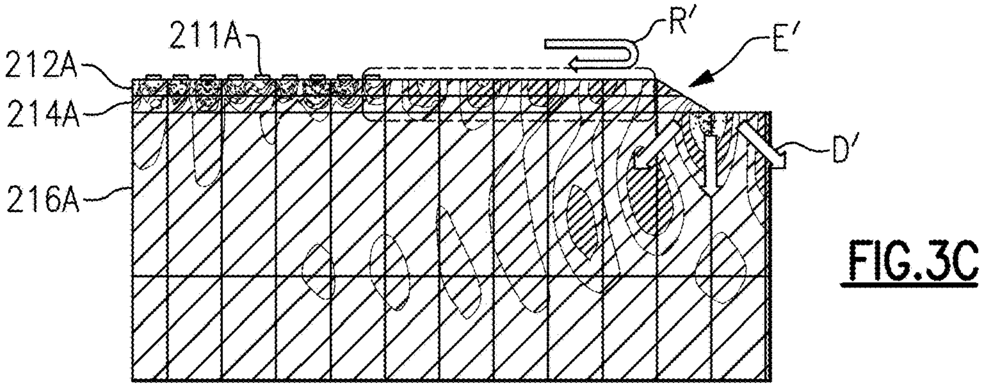
FIG. 3C shows an image of acoustic wave propagation through the multi-layer piezoelectric substrate (MPS) structure of FIG. 3A.

FIG. 3C shows a simulation of an image of acoustic wave propagation through a multi-layer piezoelectric substrate (MPS) similar to the MPS 201A of FIGS. 3A-3B. FIG. 3C shows that having the outer edge E' (e.g., outer edge E1' of the piezoelectric layer 212A and outer edge E2' of the functional layer 214A) tapered relative to (a surface of) the substrate 216 results in a reduced edge acoustic reflection R' as compared to the multi-layer piezoelectric substrate (MPS) 201 in FIGS. 2A-2B, and more of the acoustic wave is deflected D', which improves the performance of the MPS 201A in a filter.

Figure 4A:
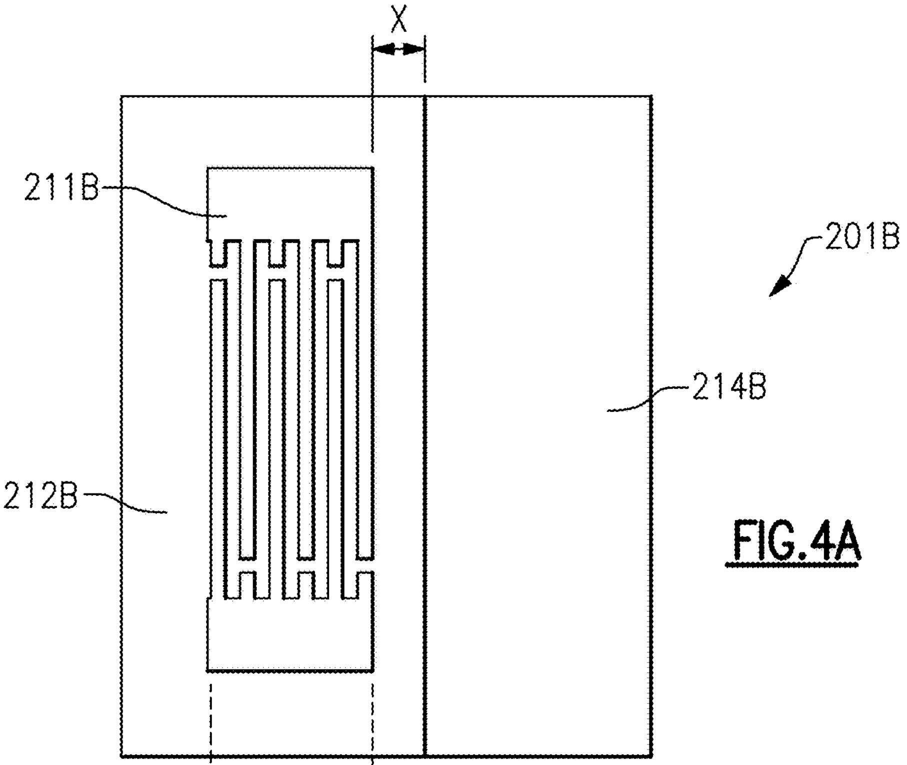
FIG. 4A illustrates a top view of an end portion of the multi-layer piezoelectric substrate (MPS).
Figure 4B:
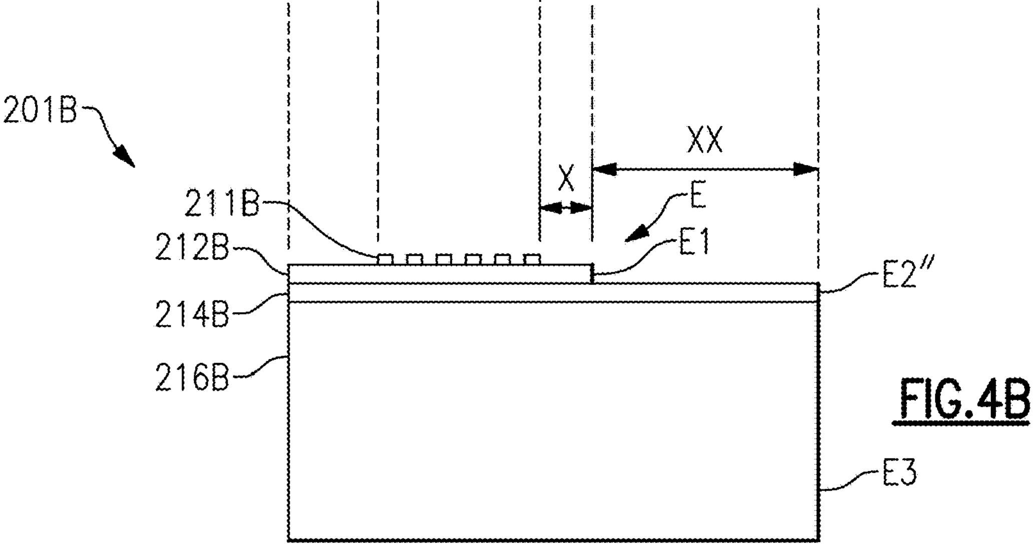
FIG. 4B illustrates a side view of the end portion of the multi-layer piezoelectric substrate (MPS) structure of FIG. 4A.

FIGS. 4A-4B show a partial top view and a side view of an end portion of a multi-layer piezoelectric substrate (MPS) 201B of a packaged acoustic wave component similar to the component 200 (e.g., a multi-layer piezoelectric substrate (MPS) package or structure). The multi-layer piezoelectric substrate (MPS) 201B is similar to the multi-layer piezoelectric substrate (MPS) 201 of FIGS. 2A-2B. Thus, reference numerals used to designate the various components of the multi-layer piezoelectric substrate (MPS) 201B are identical to those used for identifying the corresponding components of the multi-layer piezoelectric substrate (MPS) 201 in FIGS. 2A-2B, except that a "B" has been added to the numerical identifier. Therefore, the structure and description for the various features and components of the multi-layer piezoelectric substrate (MPS) 201 in FIGS. 2A-2B are understood to also apply to the corresponding features of the multi-layer piezoelectric substrate (MPS) 201B in FIGS. 4A-4B, except as described below.

The multi-layer piezoelectric substrate (MPS) 201B differs from the multi-layer piezoelectric substrate (VIPS) 201 in that the outer edge E2" of the functional layer 214B extends to and is aligned with an outer edge E3 of the substrate 216B and spaced from the outer edge E1 of the piezoelectric layer 212B by a distance XX. The outer edge E1 of the piezoelectric layer 212B is perpendicular to (a surface of) the functional layer 214B. The outer edge E2" of the functional layer 214B is aligned (e.g., co-planar) with the outer edge E3 of the substrate 216B.

Figure 4C:
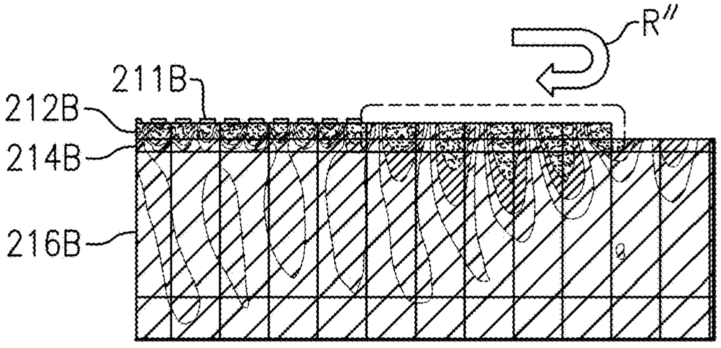
FIG. 4C shows an image of acoustic wave propagation through the multi-layer piezoelectric substrate (MPS) structure of FIG. 4A.

FIG. 4C shows an image of acoustic wave propagation through a multi-layer piezoelectric substrate (MPS) similar to the MPS 201B of FIGS. 4A-4B. FIG. 4C shows that having the outer edge E2" of the functional layer 214B aligned with an outer edge E3 of the substrate 216B and spaced from the outer edge E1 of the piezoelectric layer 212B by a distance XX results in an increased (e.g., strong) edge acoustic reflection R", which can affect (e.g., worsen) the performance of the MPS 201A in a filter.

Figure 5A:
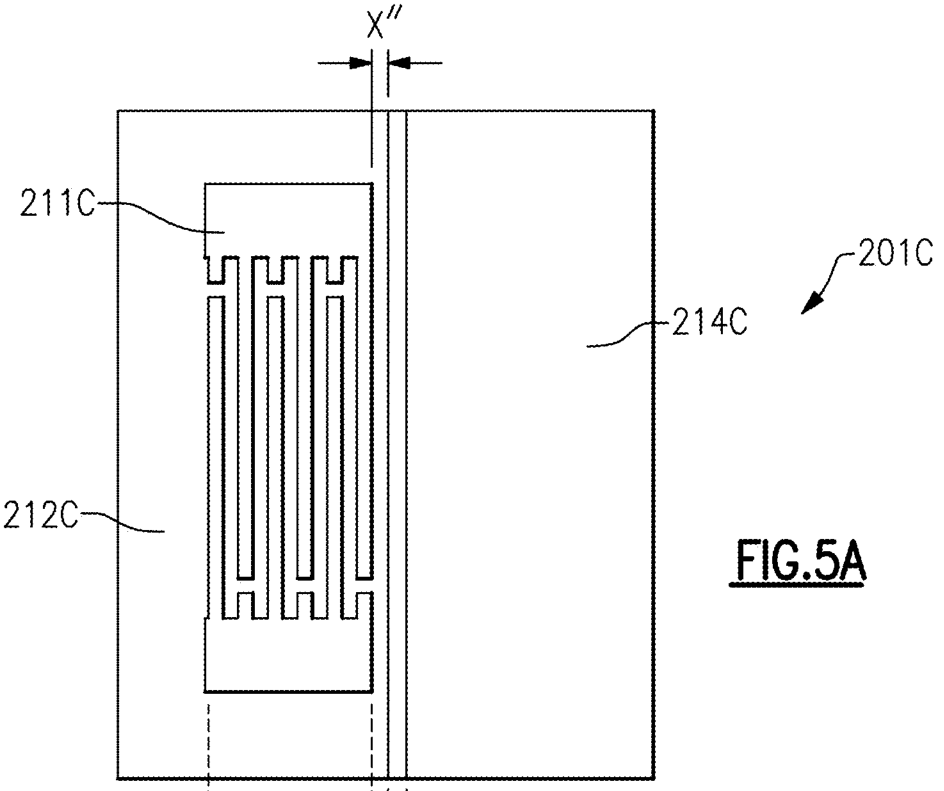
FIG. 5A illustrates a top view of an end portion of the multi-layer piezoelectric substrate (MPS).
Figure 5B:
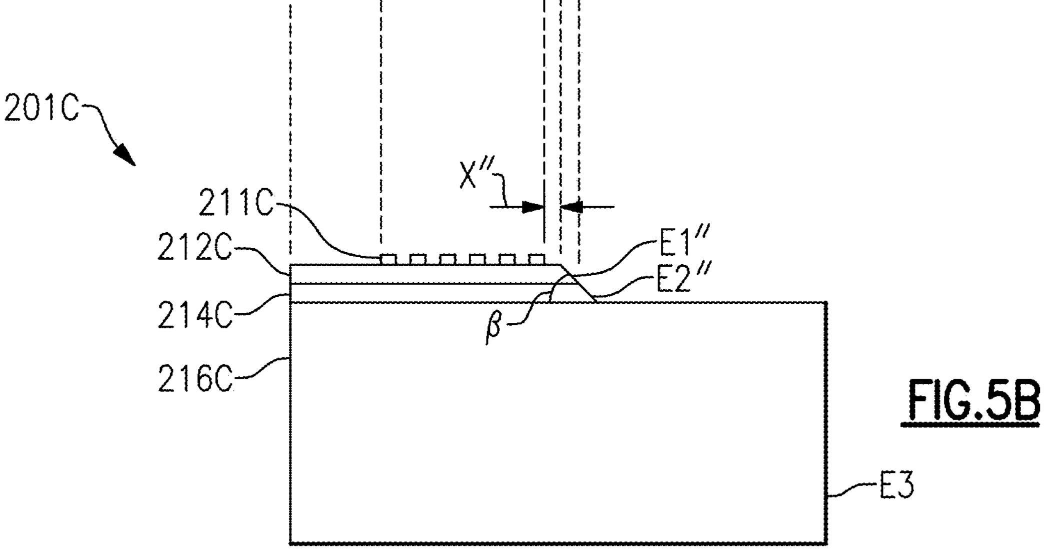
FIG. 5B illustrates a side view of the end portion of the multi-layer piezoelectric substrate (MPS) structure of FIG. 5A.

FIGS. 5A-5B show a partial top view and a side view of an end portion of a multi-layer piezoelectric substrate (MPS) 201C of a packaged acoustic wave component similar to the component 200 (e.g., a multi-layer piezoelectric substrate (MPS) package or structure). The multi-layer piezoelectric substrate (MPS) 201C is similar to the multi-layer piezoelectric substrate (MPS) 201B of FIGS. 4A-4B. Thus, reference numerals used to designate the various components of the multi-layer piezoelectric substrate (MPS) 201C are identical to those used for identifying the corresponding components of the multi-layer piezoelectric substrate (MPS) 201B in FIGS. 4A-4B, except that a "C" instead of a "B" has been added to the numerical identifier. Therefore, the structure and description for the various features and components of the multi-layer piezoelectric substrate (MPS) 201B in FIGS. 4A-4B (which are based on structure and description of corresponding features for MPS 201 in FIGS. 2A-2B) are understood to also apply to the corresponding features of the multi-layer piezoelectric substrate (MPS) 201C in FIGS. 5A-5B, except as described below.

The multi-layer piezoelectric substrate (MPS) 201C differs from the multi-layer piezoelectric substrate (MPS) 201B in that the outer edge E1' of the piezoelectric layer 212C is tapered at an angle β (e.g., at a non-perpendicular angle, such as an acute angle) relative to the functional layer 214C. The IDT 211C is spaced from the tapered outer edge E1' of the piezoelectric layer 212C by a distance X".

Figure 5C:
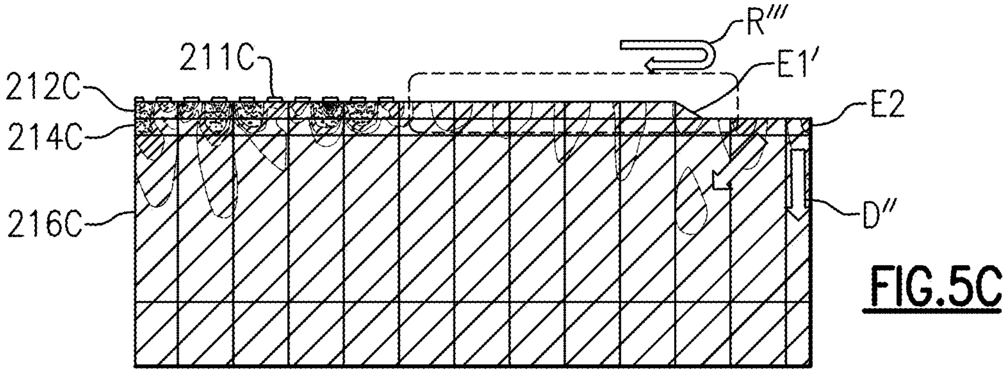
FIG. 5C shows an image of acoustic wave propagation through the multi-layer piezoelectric substrate (MPS) structure of FIG. 5A.

FIG. 5C shows an image of acoustic wave propagation through a multi-layer piezoelectric substrate (MPS) similar to the MPS 201C of FIGS. 5A-5B. FIG. 5C shows that having the outer edge E1' of the piezoelectric layer 212C is tapered at an angle β (e.g., at a non-perpendicular angle, such as an acute angle) relative to the functional layer 214C results in a reduced edge acoustic reflection R''' as compared to the multi-layer piezoelectric substrate (MPS) 201B in FIGS. 4A-4B, and more of the acoustic wave is deflected D", which improves the performance of the MPS 201C in a filter. FIG. 5C also shows that the tapering of the piezoelectric layer 212C has a greater effect on reducing acoustic reflection for the multi-layer piezoelectric substrate (e.g., because the acoustic wave is concentrated on the upper surface of the piezoelectric layer 212C).

Figure 6:
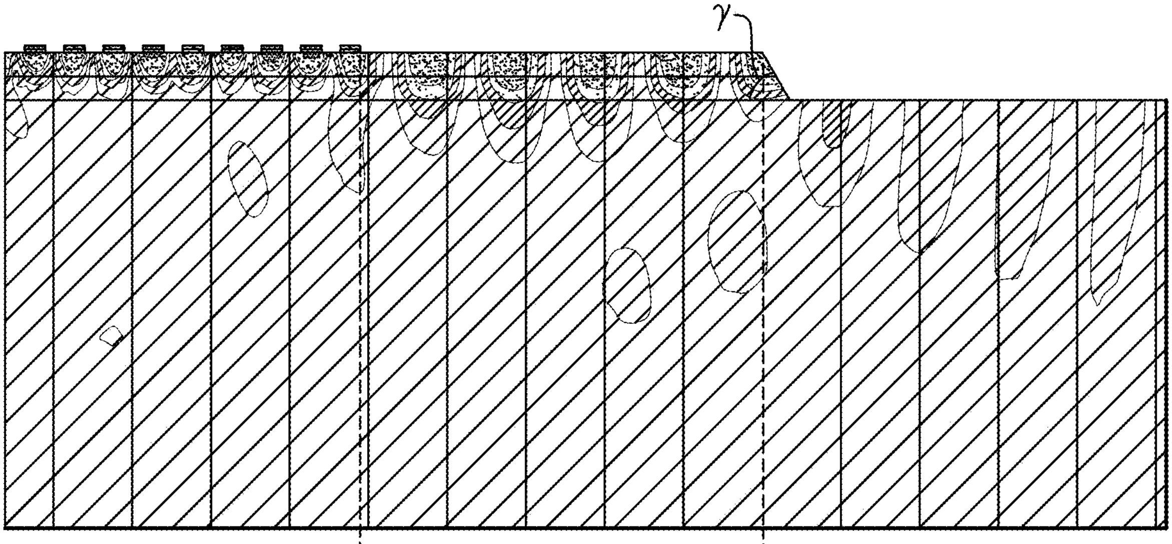
FIG. 6 shows an image of acoustic wave propagation through a multi-layer piezoelectric substrate (MPS) structure.
Figure 7:
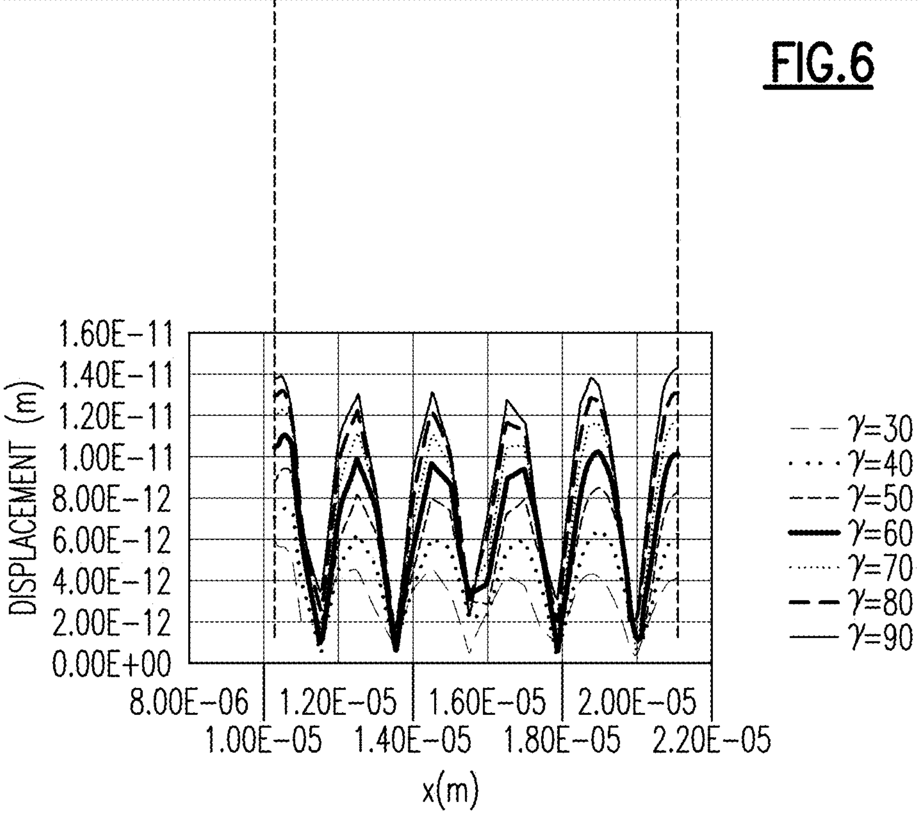
FIG. 7 shows a graph of displacement or spatial vibration magnitude for the acoustic wave in the MPS structure of FIG. 6 versus location along the MPS structure.
Figure 8:
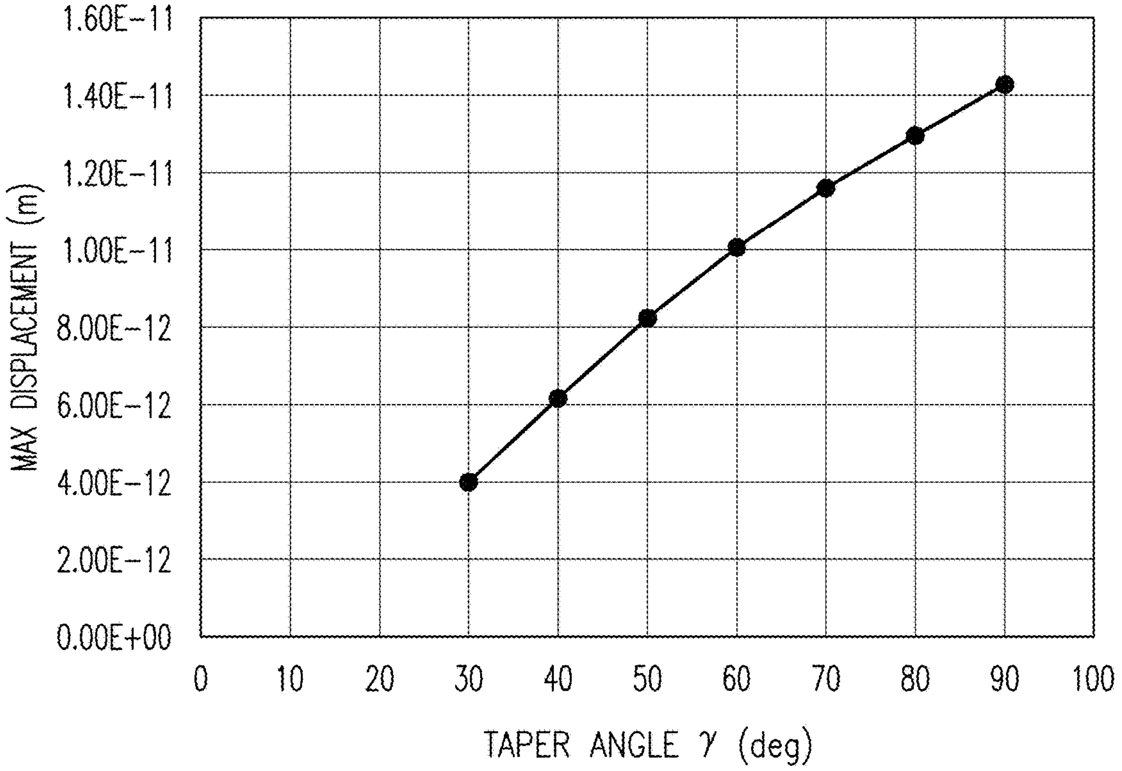
FIG. 8 shows a graph of maximum displacement or maximum spatial vibration magnitude for the acoustic wave in the MPS structure of FIG. 6 versus taper angle for the edge of the piezoelectric layer and functional layer.

FIG. 6 shows an image of acoustic wave propagation through a multi-layer piezoelectric substrate (MPS) similar to the MPS 201A. FIG. 7 shows a graph of displacement or spatial vibration magnitude (which provide an indication of acoustic reflection) for the acoustic wave in the MPS structure of FIG. 6 versus location along the MPS structure for various values of taper angle γ of the piezoelectric layer (and functional layer) relative to the substrate of the MPS. FIG. 8 shows a graph of maximum displacement or maximum spatial vibration magnitude in FIG. 7 for the acoustic wave in the MPS structure of FIG. 6 versus tape angle γ for the edge of the piezoelectric layer (and functional layer) relative to the substrate of the MPS. As shown in FIG. 8, a taper angle γ of 60 degrees for the outer edge of the piezoelectric layer (and functional layer) results in a reduction in the maximum displacement or maximum spatial vibration magnitude for the acoustic wave in the MPS structure of approximately 29% as compared to the MPS having an outer edge for the piezoelectric layer (and functional layer) that is perpendicular (e.g., at angle γ of 90 degrees) relative to the substrate (e.g., (1.40E-11−1.00E-11)/1.40E-11). Similarly, a taper angle γ of 80 degrees results in a reduction in the maximum displacement or maximum spatial vibration magnitude for the acoustic wave in the MPS structure of approximately 14%. Therefore, having a taper angle γ of less than 90 degrees (e.g., between 30 degrees and 89 degrees) for the outer edge of the piezoelectric layer (and functional layer) results in a reduction in acoustic reflection for the MPS, as compared to the MPS having an outer edge for the piezoelectric layer (and functional layer) that is perpendicular (e.g., at angle γ of 90 degrees) relative to the substrate. In some implementations, the taper angle γ outer edge for the piezoelectric layer (and functional layer) relative to the substrate layer can preferably be between 45 degrees and 80 degrees (e.g., 45 degrees, 50 degrees, 60 degrees, 80 degrees, and values in between).

Figure 9:
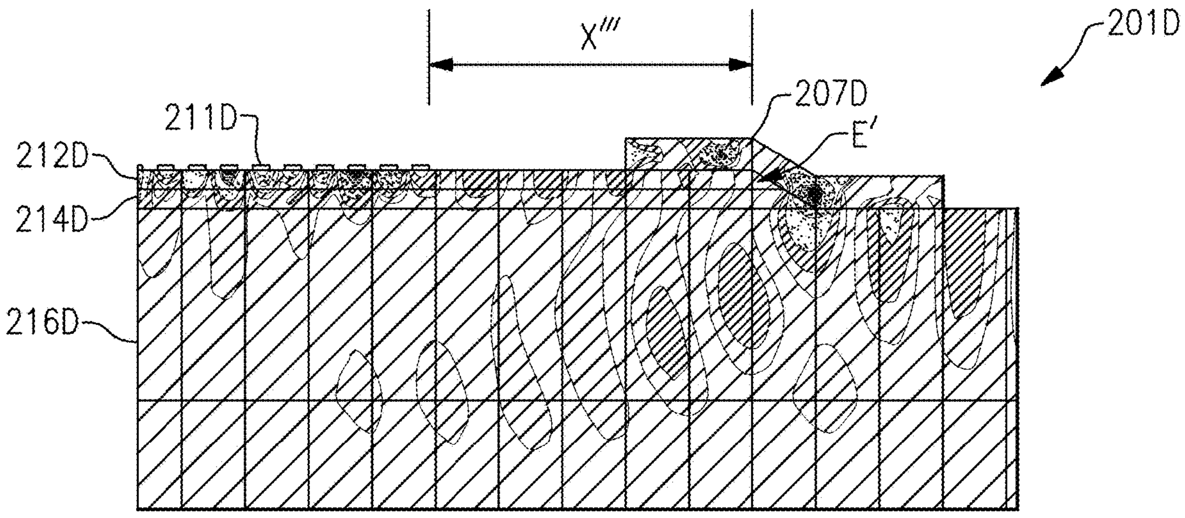
FIG. 9 is an image of acoustic wave propagation through the multi-layer piezoelectric substrate (MPS) structure with a polyimide layer over the tapered edge of the piezoelectric and functional layers.

FIG. 9 shows an image of acoustic wave propagation through a multi-layer piezoelectric substrate (MPS) 201D of a packaged acoustic wave component similar to the component 200 (e.g., a multi-layer piezoelectric substrate (MPS) package or structure). The multi-layer piezoelectric substrate (MPS) 201D is similar to the multi-layer piezoelectric substrate (MPS) 201A of FIGS. 3A-3C. Thus, reference numerals used to designate the various components of the multi-layer piezoelectric substrate (MPS) 201D are identical to those used for identifying the corresponding components of the multi-layer piezoelectric substrate (MPS) 201A in FIGS. 3A-3C, except that a "D" instead of an "A" has been added to the numerical identifier. Therefore, the structure and description for the various features and components of the multi-layer piezoelectric substrate (MPS) 201A in FIGS. 3A-3C (which are based on structure and description of corresponding features for MPS 201 in FIGS. 2A-2B) are understood to also apply to the corresponding features of the multi-layer piezoelectric substrate (MPS) 201D in FIG. 9, except as described below.

The multi-layer piezoelectric substrate (MPS) 201D differs from the multi-layer piezoelectric substrate (MPS) 201A in that a polyimide layer 207D is disposed over the tapered outer edge E' of the piezoelectric layer 212D and functional layer 214D, as well as over a portion of the substrate 216D. Adding the polyimide layer to the outer edge E' of the piezoelectric layer 212D and functional layer 214D also results in a reduction of acoustic reflection, though the effect on acoustic reflection from the polyimide layer is not as strong as having the tapered outer edge E' (e.g. with an angle such as γ in FIG. 8), because polyimide is a soft polymer. Advantageously, adding the polyimide layer 207D provides acoustic damping that allows for a smaller distance X''' between the IDT 211D and the outer edge E', allowing the overall MPS 201D structure to have a smaller width and therefore smaller overall size (as compared with a similar MPS structure without the polyimide layer).

Figure 10:
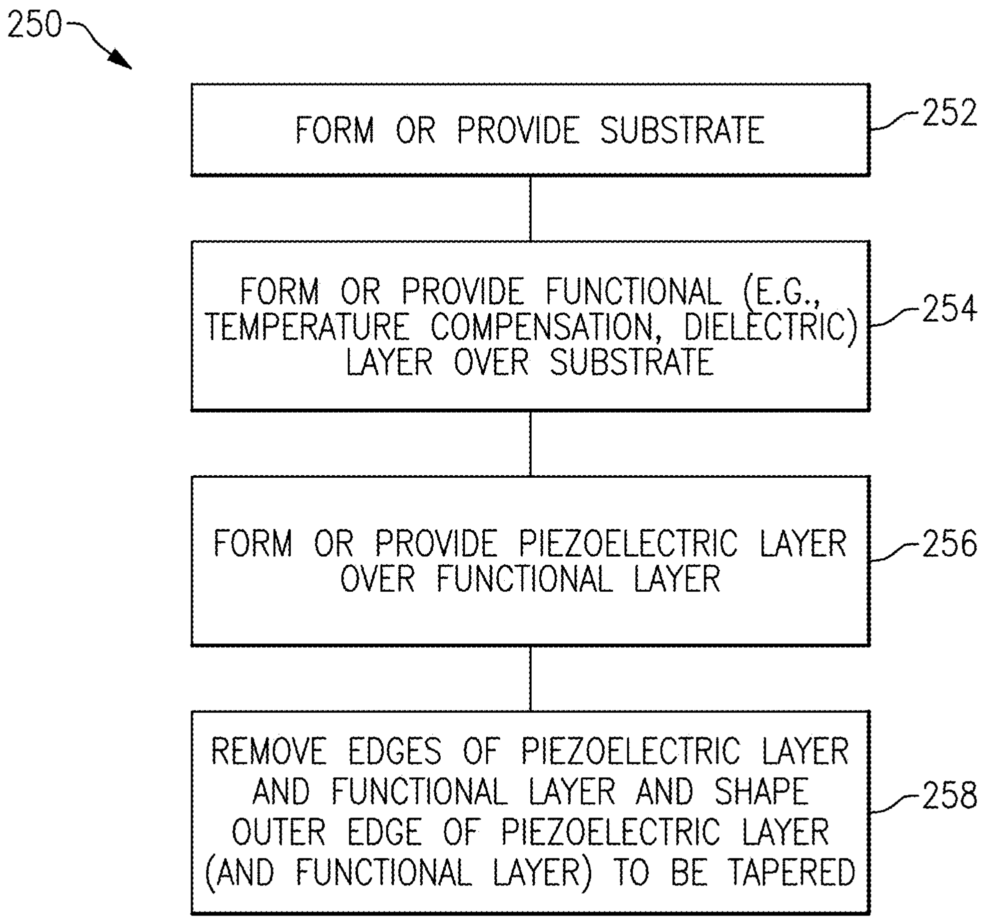
FIG. 10 is a flowchart of a process for making the multi-layer piezoelectric substrate (MPS) structure with a tapered edge for the piezoelectric and functional layers.

FIG. 10 illustrates a method 250 of making a multi-layer piezoelectric substrate (MPS), such as the MPS 201A, 201C, 201D, for a packaged acoustic wave component, such as the component 200 in FIG. 1. The method 250 includes the step 252 of forming or providing a substrate (e.g., substrate 216A, 216C, 216D). The method 250 includes the step 254 of forming or providing a functional (e.g., temperature compensation, dielectric) structure or layer (such as the functional layer 214A, 214C, 214D) over the substrate. The method 250 includes the step 256 of forming or providing a piezoelectric structure or layer (such as the piezoelectric layer 212A, 212C, 212D) over the functional layer. The method 250 includes the step 258 of removing (e.g., etching) an outer edge or boundary of the piezoelectric layer and functional layer and shaping the outer edge of the piezoelectric layer (and optionally the functional layer) to be tapered (e.g., at an angle less than 90 degrees, such as between 30-89 degrees, preferably between 45 and 80 degrees) relative to a surface of the substrate. In one implementation, a method of making a radio frequency module includes the steps above for method 250 in addition to forming or providing a package substrate and attaching additional circuitry and the MPS to the package substrate.

An MPS acoustic wave resonator or device or die in a packaged acoustic wave component, including any suitable combination of features disclosed herein, can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS acoustic wave resonators disclosed herein. FR1 can be from 410 MHz to 7.125 GHz, for example, as specified in a current 5G NR specification. In 5G applications, the thermal dissipation of the MPS acoustic wave resonators disclosed herein can be advantageous. For example, such thermal dissipation can be desirable in 5G applications with a higher time-division duplexing (TDD) duty cycle compared to fourth generation (4G) Long Term Evolution (LTE). One or more MPS acoustic wave resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figure 11A:
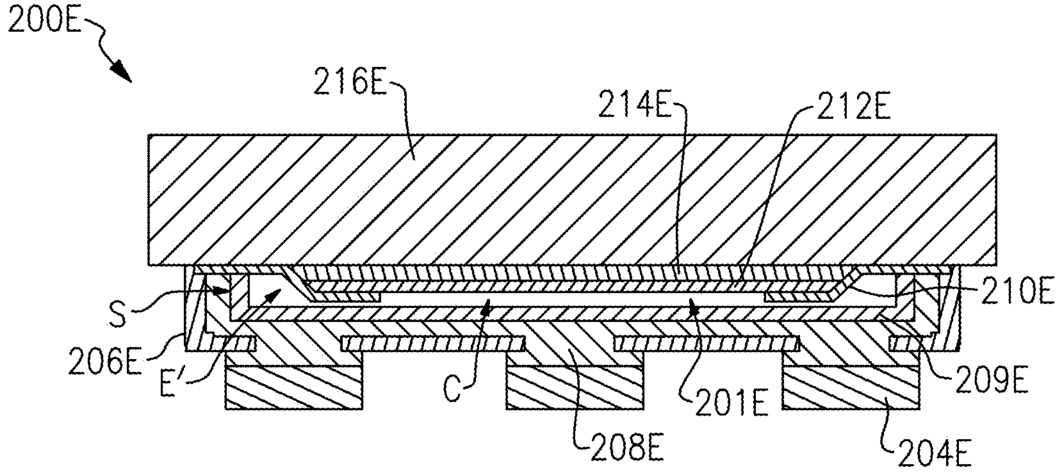
FIG. 11A illustrates a schematic cross-sectional side view of a multi-layer piezoelectric substrate (MPS) package structure with a tapered piezoelectric layer.

FIG. 11A shows a packaged acoustic wave component 200E (e.g., a chip scale package or CSP). The component 200E is similar to the packaged acoustic wave component 200 of FIG. 1. Thus, reference numerals used to designate the various components of the packaged acoustic wave component 200 of FIG. 1 are identical to those used for identifying the corresponding components of the packaged acoustic wave component 200E in FIG. 11A, except that an “E” has been added to the numerical identifier. Therefore, the structure and description for the various features and components of the packaged acoustic wave component 200 in FIG. 1 are understood to also apply to the corresponding features of the packaged acoustic wave component 200E in FIG. 11A, except as described below.

The packaged acoustic wave component 200E differs from the packaged acoustic wave component 200 in that the outer edge or perimeter E' of the piezoelectric layer 212E (and dielectric layer 214E) is tapered and spaced inward of the polyimide layer 209E and the metal portion 208E. The piezoelectric layer 212E and dielectric layer 214E (along with the substrate 216E) can be part of a multi-layer piezoelectric substrate (MPS) 201E. Also, the signal lines 210E that extend from the substrate 216E to the piezoelectric layer 212E (e.g., over a surface of the piezoelectric layer 212E) have an angled portion adjacent the tapered outer edge or perimeter E' of the piezoelectric layer 212E (and the dielectric layer 214E). The piezoelectric layer 212E (and dielectric layer 214E) can be tapered in the manner described above in connection with the multi-layer piezoelectric substrate (MPS) 201A, 201C in FIGS. 3A-3C and 5A-5C.

Figure 11B:
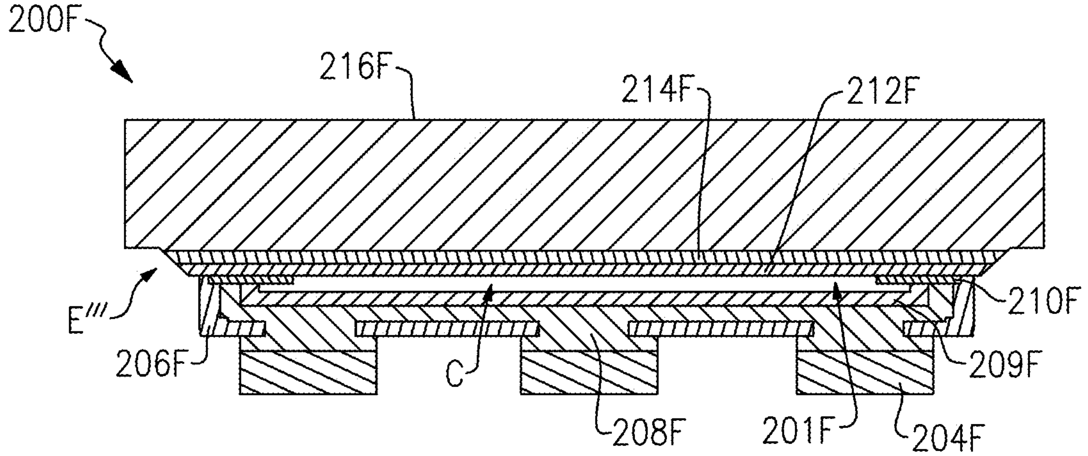
FIG. 11B illustrates a schematic cross-sectional side view of a multi-layer piezoelectric substrate (MPS) package structure with a tapered piezoelectric layer.

FIG. 11B shows a packaged acoustic wave component 200F (e.g., a chip scale package or CSP). The component 200F is similar to the packaged acoustic wave component 200 of FIG. 1. Thus, reference numerals used to designate the various components of the packaged acoustic wave component 200 of FIG. 1 are identical to those used for identifying the corresponding components of the packaged acoustic wave component 200F in FIG. 11B, except that an “F” has been added to the numerical identifier. Therefore, the structure and description for the various features and components of the packaged acoustic wave component 200 in FIG. 1 are understood to also apply to the corresponding features of the packaged acoustic wave component 200F in FIG. 11B, except as described below.

The packaged acoustic wave component 200F differs from the packaged acoustic wave component 200 in that the outer edge or perimeter E''' of the piezoelectric layer 212F (and dielectric layer 214F) is tapered and extends outward past the metal portion 208F and dielectric overcoat 206F (e.g., a width of the piezoelectric layer 212F is greater than a width of the dielectric overcoat 206F and metal portion 208F). Signal lines 210F can extend linearly between the metal portion 208F and the piezoelectric layer 212F. The piezoelectric layer 212F and dielectric layer 214F (along with the substrate 216F) can be part of a multi-layer piezoelectric substrate (MPS) 201F. The outer edge or perimeter E''' of the piezoelectric layer 212F (and dielectric layer 214F) can be etched on the dicing street or line, for example when singulating the packages 200F from a wafer. The piezoelectric layer 212F (and dielectric layer 214F) can be tapered in the manner described above in connection with the multi-layer piezoelectric substrate (MPS) 201A, 201C in FIGS. 3A-3C and 5A-5C.

Figure 11C:
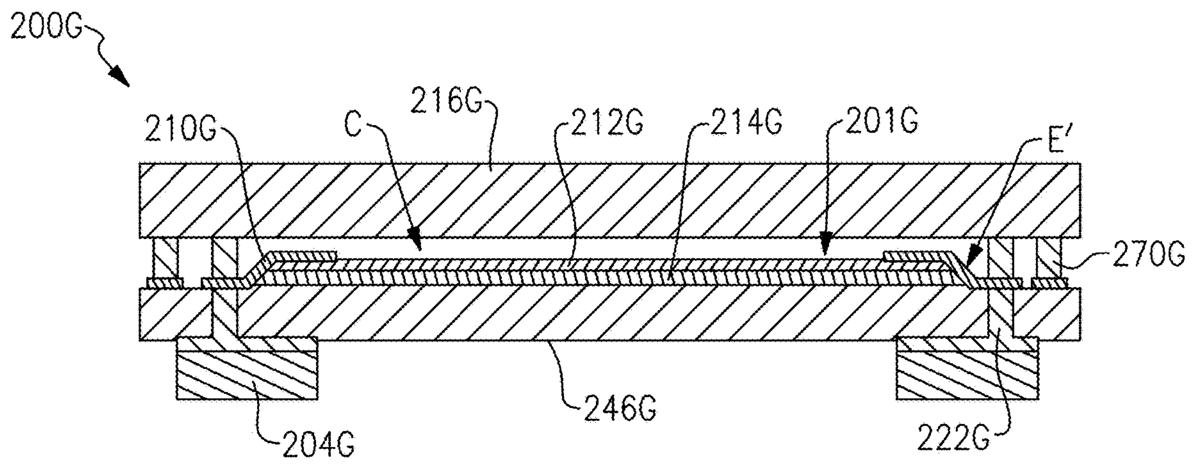
FIG. 11C illustrates a schematic cross-sectional side view of a multi-layer piezoelectric substrate (MPS) package structure with a tapered piezoelectric layer.

FIG. 11C shows a packaged acoustic wave component 200G having a multi-layer piezoelectric substrate (MPS) 201G that includes a piezoelectric layer 212G and a dielectric layer 214G disposed over a substrate 246G, where the dielectric layer 214G is interposed between the substrate 246G and the piezoelectric layer 212G. The outer edge or perimeter E' of the piezoelectric layer 212G (and the dielectric layer 214G) is tapered and spaced inward of vias 222G. Signal lines 210E extend from the substrate 246G to the piezoelectric layer 212G (e.g., over a surface of the piezoelectric layer 212G) and have an angled portion adjacent the tapered outer edge or perimeter E' of the piezoelectric layer 212G (and the dielectric layer 214G). The piezoelectric layer 212G (and dielectric layer 214G) can be tapered in the manner described above in connection with the multi-layer piezoelectric substrate (MPS) 201A, 201C in FIGS. 3A-3C and 5A-5C.

The vias 222G extend through the substrate 246G and connect to solder connections 204G. The vias 222G also extend to a cap substrate 216G spaced above the piezoelectric layer 212G to define a cavity C between the substrate 246G and the cap substrate 216G. Additionally, the cap substrate 216G is supported by a frame 270G (e.g., seal ring) that extends between the cap substrate 216G and the substrate 246G and space outward from the vias 222G.

Figure 11D:
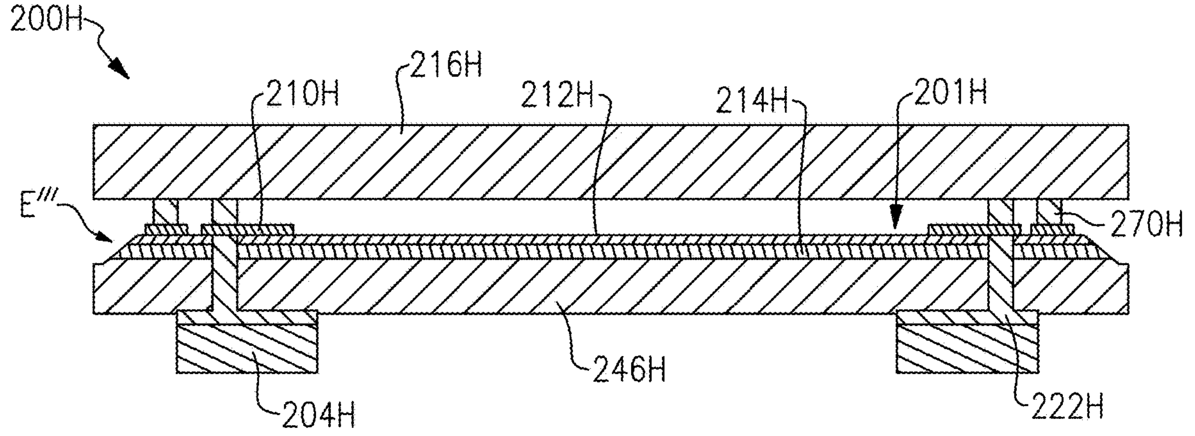
FIG. 11D illustrates a schematic cross-sectional side view of a multi-layer piezoelectric substrate (MPS) package structure with a tapered piezoelectric layer.

FIG. 11D shows a packaged acoustic wave component 200H. The component 200H is similar to the packaged acoustic wave component 200G of FIG. 11C. Thus, reference numerals used to designate the various components of the packaged acoustic wave component 200H of FIG. 11D are identical to those used for identifying the corresponding components of the packaged acoustic wave component 200G in FIG. 11C, except that an “H” has been added to the numerical identifier. Therefore, the structure and description for the various features and components of the packaged acoustic wave component 200G in FIG. 11C are understood to also apply to the corresponding features of the packaged acoustic wave component 200H in FIG. 11D, except as described below.

The packaged acoustic wave component 200H differs from the packaged acoustic wave component 200G in that the outer edge or perimeter E''' of the piezoelectric layer 212H (and dielectric layer 214H) is tapered and extends outward past the frame 270H (e.g. seal ring) (e.g., a width of the piezoelectric layer 212H is greater than a width between opposite ends of the frame 270H). Signal lines 210H can extend linearly between over the piezoelectric layer 212H and connect to the vias 222H. The piezoelectric layer 212H and dielectric layer 214H (along with the substrate 246H) can be part of a multi-layer piezoelectric substrate (MPS) 201H. The outer edge or perimeter E''' of the piezoelectric layer 212H (and dielectric layer 214H) can be etched on the dicing street or line, for example when singulating the packages 200H from a wafer. The piezoelectric layer 212H (and dielectric layer 214H) can be tapered in the manner described above in connection with the multi-layer piezoelectric substrate (MPS) 201A, 201C in FIGS. 3A-3C and 5A-5C.

Figure 11E:
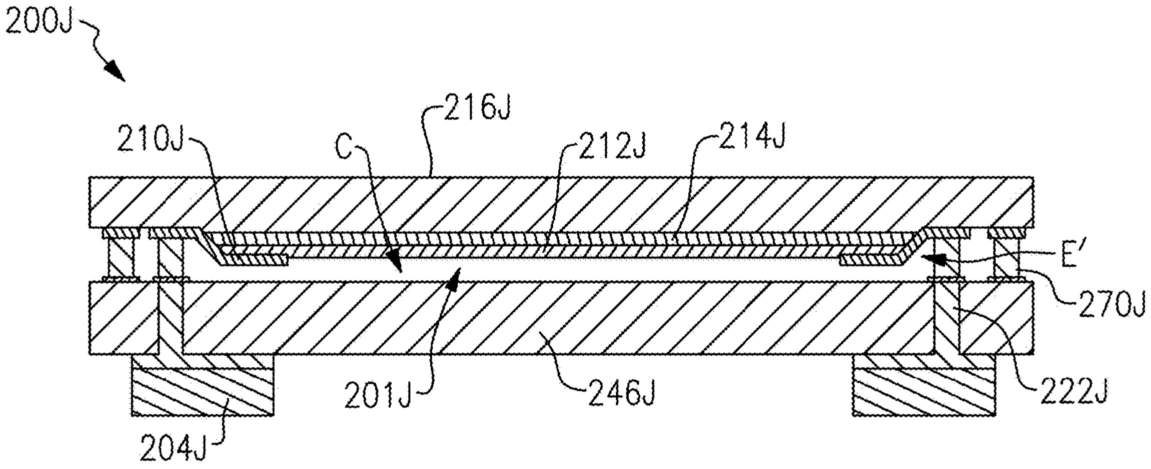
FIG. 11E illustrates a schematic cross-sectional side view of a multi-layer piezoelectric substrate (MPS) package structure with a tapered piezoelectric layer.

FIG. 11E shows a packaged acoustic wave component 200J having a multi-layer piezoelectric substrate (MPS) 201J that includes a piezoelectric layer 212J and a dielectric layer 214J disposed over a substrate 216J (e.g., cap substrate), where the dielectric layer 214J is interposed between the substrate 216J and the piezoelectric layer 212J. The outer edge or perimeter E' of the piezoelectric layer 212J (and the dielectric layer 214J) is tapered and spaced inward of vias 222J. Signal lines 210J extend from the substrate 216J to the piezoelectric layer 212J (e.g., over a surface of the piezoelectric layer 212J) and have an angled portion adjacent the tapered outer edge or perimeter E' of the piezoelectric layer 212J (and the dielectric layer 214J). The piezoelectric layer 212J (and dielectric layer 214J) can be tapered in the manner described above in connection with the multi-layer piezoelectric substrate (MPS) 201A, 201C in FIGS. 3A-3C and 5A-5C.

The vias 222J extend through the substrate 216J and connect to solder connections 204J. The vias 222J also extend to the cap substrate 216J spaced above the substrate 216J to define a cavity C between the cap substrate 246J and the substrate 216J. Additionally, the cap substrate 246J is supported by a frame 270J (e.g., seal ring) that extends between the cap substrate 246J and the substrate 216J and space outward from the vias 222J.

Figure 11F:
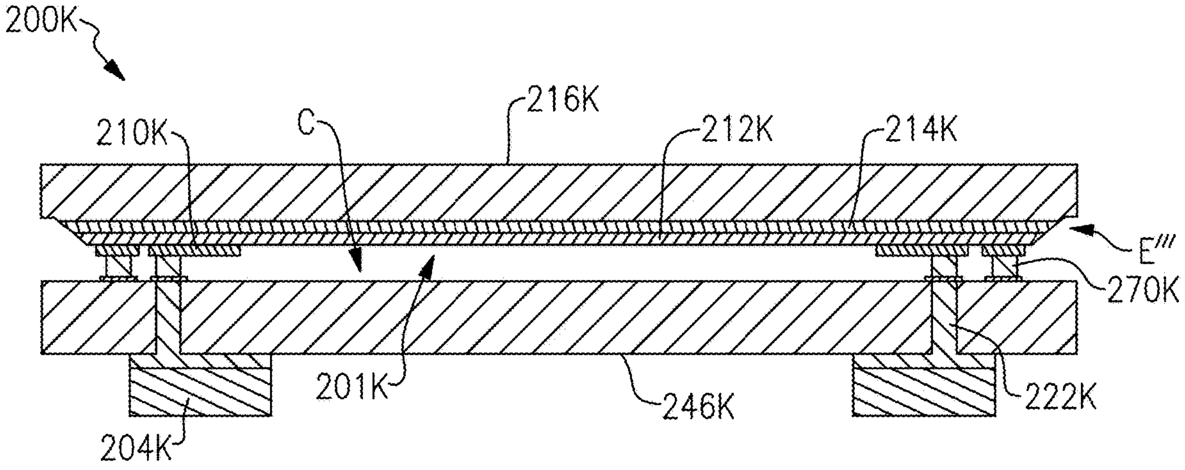
FIG. 11F illustrates a schematic cross-sectional side view of a multi-layer piezoelectric substrate (MPS) package structure with a tapered piezoelectric layer.

FIG. 11F shows a packaged acoustic wave component 200K. The component 200K is similar to the packaged acoustic wave component 200J of FIG. 11E. Thus, reference numerals used to designate the various components of the packaged acoustic wave component 200K of FIG. 11F are identical to those used for identifying the corresponding components of the packaged acoustic wave component 200J in FIG. 11E, except that an "K" has been added to the numerical identifier. Therefore, the structure and description for the various features and components of the packaged acoustic wave component 200J in FIG. 11E are understood to also apply to the corresponding features of the packaged acoustic wave component 200K in FIG. 11F, except as described below.

The packaged acoustic wave component 200K differs from the packaged acoustic wave component 200J in that the outer edge or perimeter E''' of the piezoelectric layer 212K (and dielectric layer 214K) is tapered and extends outward past the frame 270K (e.g. seal ring) (e.g., a width of the piezoelectric layer 212K is greater than a width between opposite ends of the frame 270K). Signal lines 210K can extend linearly between over the piezoelectric layer 212K and connect to the vias 222K. The piezoelectric layer 212H and dielectric layer 214K (along with the substrate 216K) can be part of a multi-layer piezoelectric substrate (MPS) 201K. The outer edge or perimeter E''' of the piezoelectric layer 212K (and dielectric layer 214K) can be etched on the dicing street or line, for example when singulating the packages 200K from a wafer. The piezoelectric layer 212K (and dielectric layer 214K) can be tapered in the manner described above in connection with the multi-layer piezoelectric substrate (MPS) 201A, 201C in FIGS. 3A-3C and 5A-5C.

Though not shown in FIGS. 11A-11F, an interdigital transducer (IDT) electrode can be disposed on the piezoelectric layer 212E, 212F, 212G, 212H, 212J, 212K.

Figure 12A:
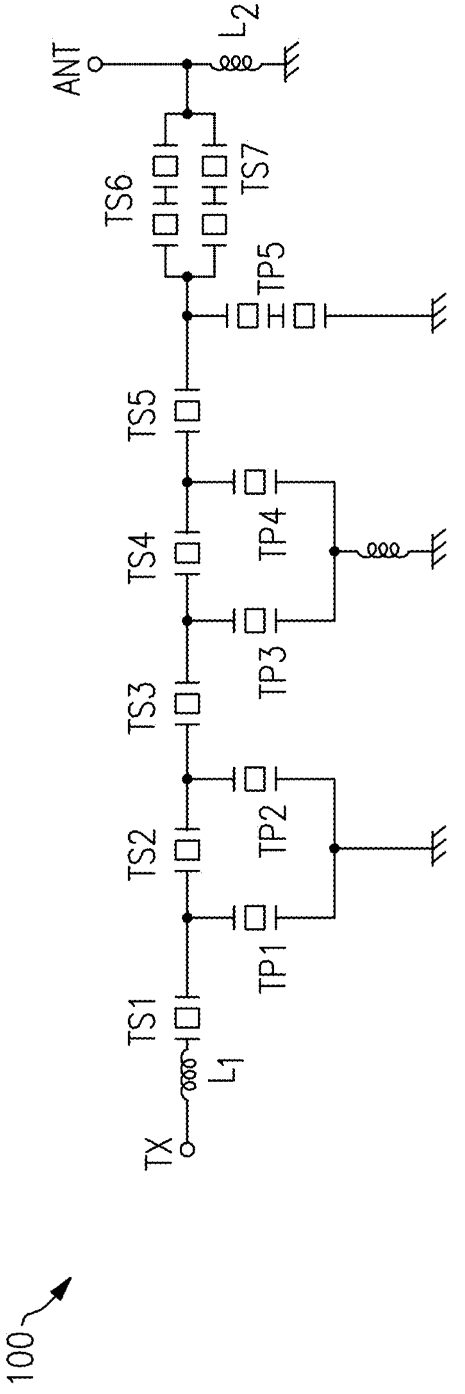
FIG. 12A is a schematic diagram of a transmit filter that includes a surface acoustic wave resonator according to an embodiment.

FIG. 12A is a schematic diagram of an example transmit filter 100 that includes surface acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 100 can be part of one or more of the acoustic wave package 200, 200E, 200F, 200G, 200H, 200J, 200K of FIGS. 1 and 11A-11F. Any suitable number of series SAW resonators and shunt SAW resonators can be included in a transmit filter 100.

Figure 12B:
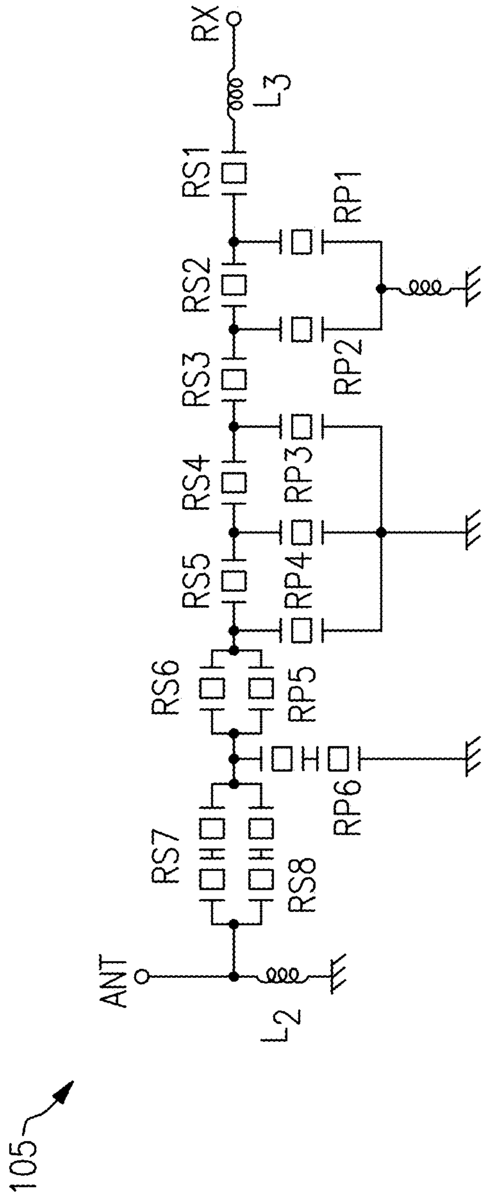
FIG. 12B is a schematic diagram of a receive filter that includes a surface acoustic wave resonator according to an embodiment.

FIG. 12B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators in accordance with any suitable principles and advantages disclosed herein. For instance, one or more of the SAW resonators of the receive filter 105 can be part of one or more of the acoustic wave package 200. Any suitable number of series SAW resonators and shunt SAW resonators can be included in a receive filter 105.

Although FIGS. 12A and 12B illustrate example ladder filter topologies, any suitable filter topology can include a SAW resonator in accordance with any suitable principles and advantages disclosed herein. Example filter topologies include ladder topology, a lattice topology, a hybrid ladder and lattice topology, a multi-mode SAW filter, a multi-mode SAW filter combined with one or more other SAW resonators, and the like.

Figure 13:
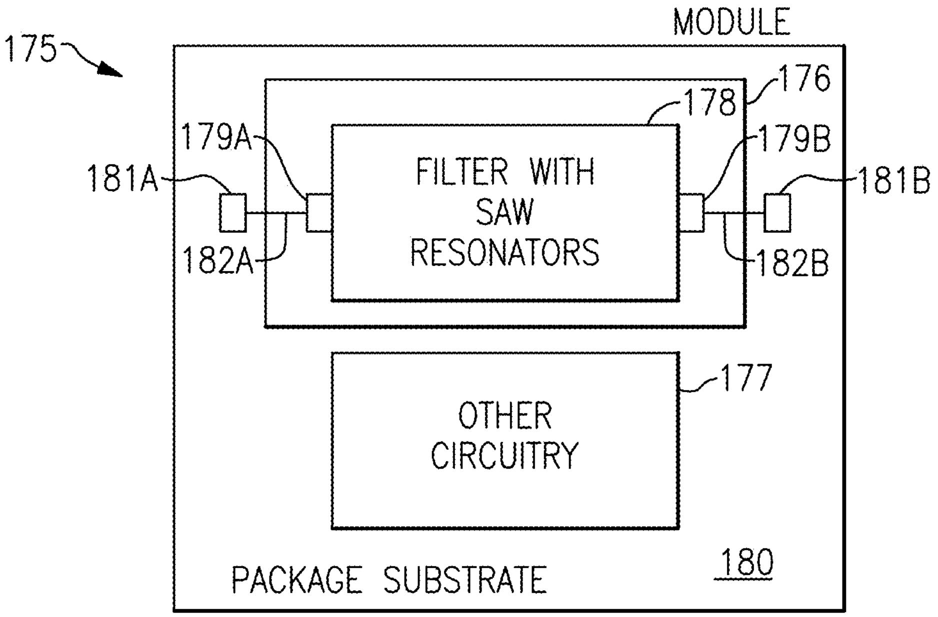
FIG. 13 is a schematic diagram of a radio frequency module that includes a surface acoustic wave resonator according to an embodiment.

FIG. 13 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators or packages disclosed herein. The SAW component 176 can include a SAW die that includes SAW resonators.

The SAW component 176 shown in FIG. 9 includes a filter 178 and terminals 179A and 179B. The filter 178 includes SAW resonators. One or more of the SAW resonators can be implemented in accordance with any suitable principles and advantages of the acoustic wave packages 200, 200E, 200F, 200G, 200H, 200J, 200K of FIGS. 1 and 11A-11F. The terminals 179A and 178B can serve, for example, as an input contact and an output contact. The SAW component 176 and the other circuitry 177 are on a common packaging substrate 180 in FIG. 13. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 14:
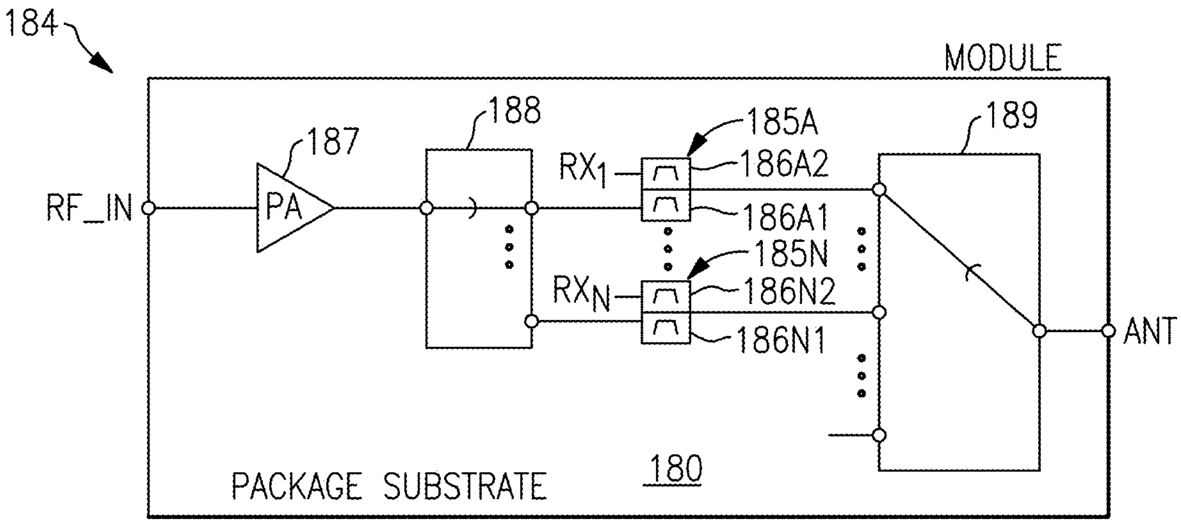
FIG. 14 is a schematic diagram of a radio frequency module that includes filters with surface acoustic wave resonators according to an embodiment.

FIG. 14 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators or packages in accordance with any suitable principles and advantages disclosed herein. Similarly, one or more of the receive filters 186A2 to 186N2 can include one or more SAW resonators in accordance with any suitable principles and advantages disclosed herein. Although FIG. 14 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 15:
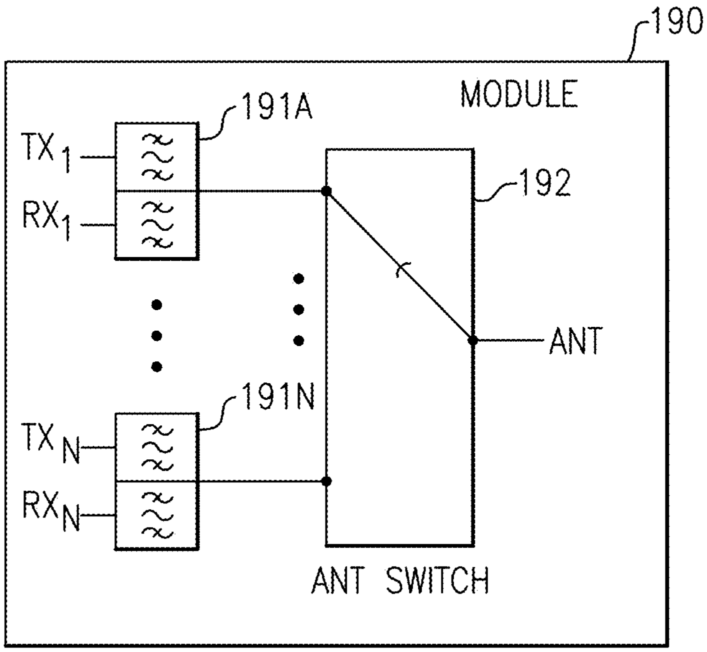
FIG. 15 is a schematic block diagram of a module that includes an antenna switch and duplexers that include a surface acoustic wave resonator according to an embodiment.

FIG. 15 is a schematic block diagram of a module 190 that includes duplexers 191A to 191N and an antenna switch 192. One or more filters of the duplexers 191A to 191N can include any suitable number of surface acoustic wave resonators or packages in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 16A:
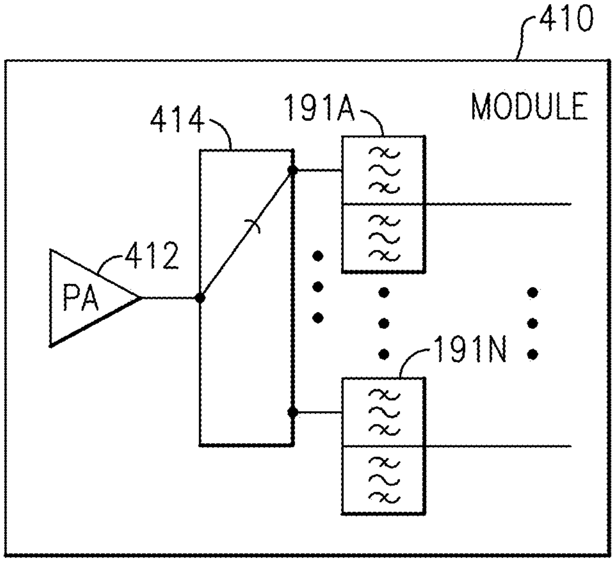
FIG. 16A is a schematic block diagram of a module that includes a power amplifier, a radio frequency switch, and duplexers that include a surface acoustic wave resonator according to an embodiment.

FIG. 16A is a schematic block diagram of a module 410 that includes a power amplifier 412, a radio frequency switch 414, and duplexers 191A to 191N in accordance with one or more embodiments. The power amplifier 412 can amplify a radio frequency signal. The radio frequency switch 414 can be a multi-throw radio frequency switch. The radio frequency switch 414 can electrically couple an output of the power amplifier 412 to a selected transmit filter of the duplexers 191A to 191N. One or more filters of the duplexers 191A to 191N can include any suitable number of surface acoustic wave resonators or packages in accordance with any suitable principles and advantages discussed herein. Any suitable number of duplexers 191A to 191N can be implemented.

Figure 16B:
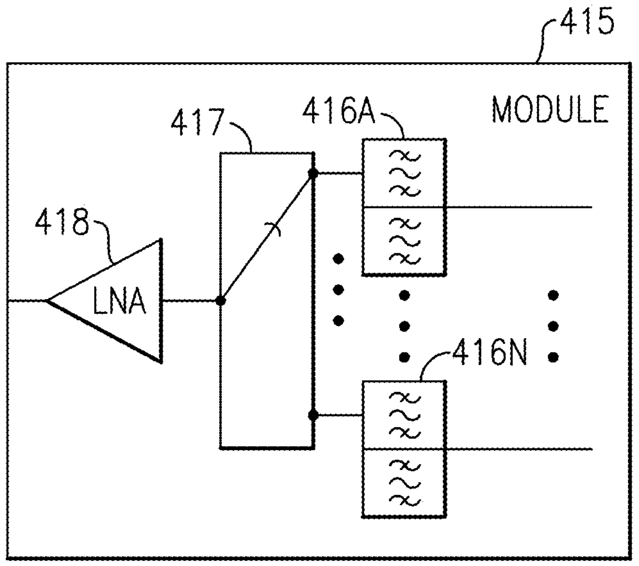
FIG. 16B is a schematic block diagram of a module that includes filters, a radio frequency switch, and a low noise amplifier according to an embodiment.

FIG. 16B is a schematic block diagram of a module 415 that includes filters 416A to 416N, a radio frequency switch 417, and a low noise amplifier 418 according to an embodiment. One or more filters of the filters 416A to 416N can include any suitable number of acoustic wave resonators or packages in accordance with any suitable principles and advantages disclosed herein. Any suitable number of filters 416A to 416N can be implemented. The illustrated filters 416A to 416N are receive filters. In some embodiments (not illustrated), one or more of the filters 416A to 416N can be included in a multiplexer that also includes a transmit filter. The radio frequency switch 417 can be a multi-throw radio frequency switch. The radio frequency switch 417 can electrically couple an output of a selected filter of filters 416A to 416N to the low noise amplifier 418. In some embodiments (not illustrated), a plurality of low noise amplifiers can be implemented. The module 415 can include diversity receive features in certain applications.

Figure 17A:
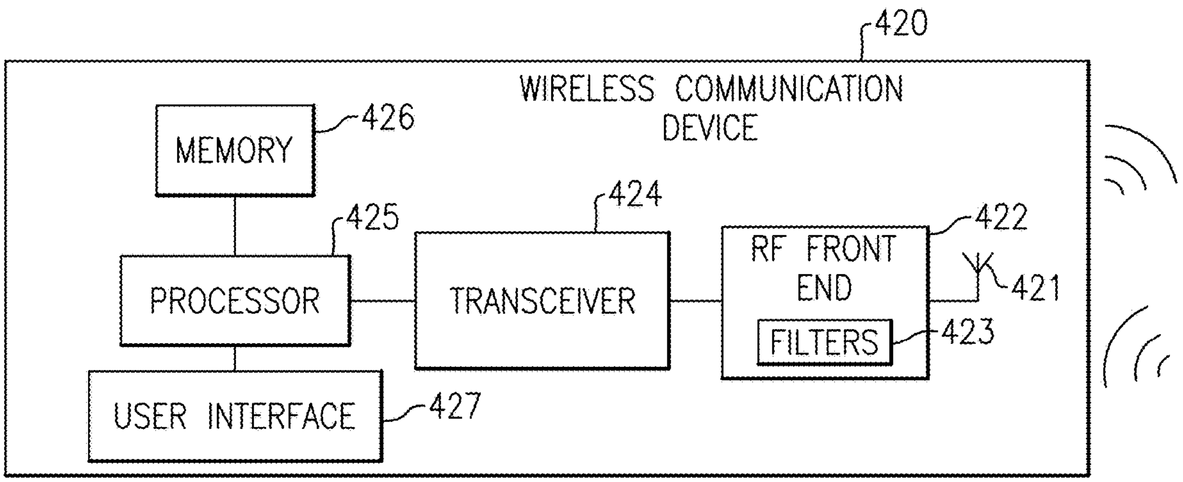
FIG. 17A is a schematic block diagram of a wireless communication device that includes a filter with a surface acoustic wave resonator in accordance with one or more embodiments.

FIG. 17A is a schematic diagram of a wireless communication device 420 that includes filters 423 in a radio frequency front end 422 according to an embodiment. The filters 423 can include one or more SAW resonators or packages in accordance with any suitable principles and advantages discussed herein. The wireless communication device 420 can be any suitable wireless communication device. For instance, a wireless communication device 420 can be a mobile phone, such as a smart phone. As illustrated, the wireless communication device 420 includes an antenna 421, an RF front end 422, a transceiver 424, a processor 425, a memory 426, and a user interface 427. The antenna 421 can transmit/receive RF signals provided by the RF front end 422. Such RF signals can include carrier aggregation signals. Although not illustrated, the wireless communication device 420 can include a microphone and a speaker in certain applications.

The RF front end 422 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 422 can transmit and receive RF signals associated with any suitable communication standards. The filters 423 can include SAW resonators of a SAW component or package that includes any suitable combination of features discussed with reference to any embodiments discussed above.

The transceiver 424 can provide RF signals to the RF front end 422 for amplification and/or other processing. The transceiver 424 can also process an RF signal provided by a low noise amplifier of the RF front end 422. The transceiver 424 is in communication with the processor 425. The processor 425 can be a baseband processor. The processor 425 can provide any suitable base band processing functions for the wireless communication device 420. The memory 426 can be accessed by the processor 425. The memory 426 can store any suitable data for the wireless communication device 420. The user interface 427 can be any suitable user interface, such as a display with touch screen capabilities.

Figure 17B:
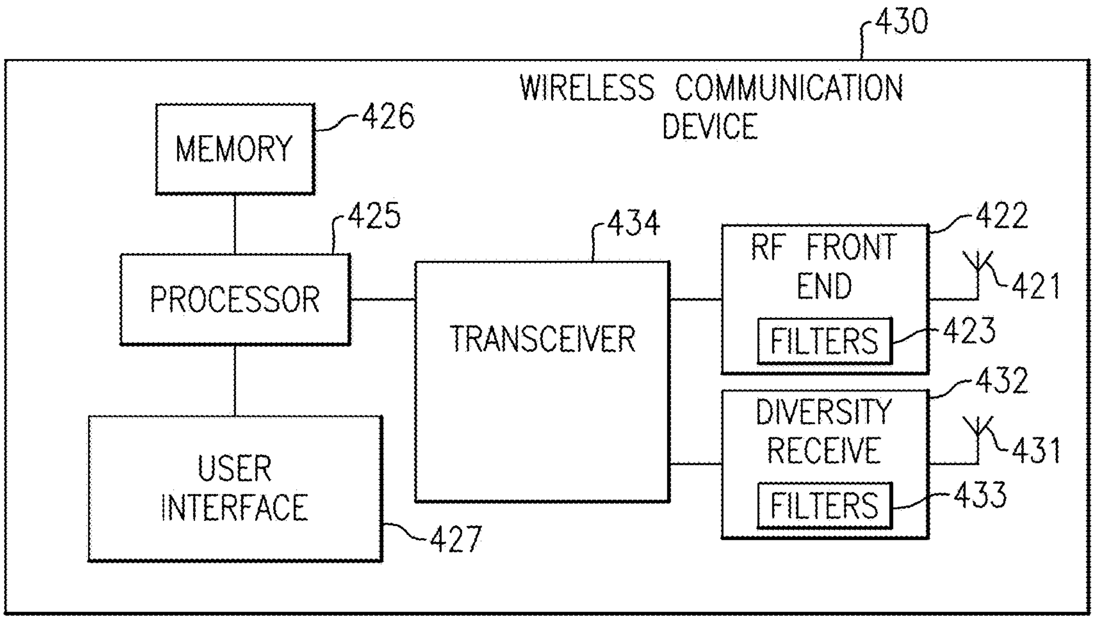
FIG. 17B is a schematic block diagram of another wireless communication device that includes a filter with a surface acoustic wave resonator in accordance with one or more embodiments.

FIG. 17B is a schematic diagram of a wireless communication device 430 that includes filters 423 in a radio frequency front end 422 and a second filter 433 in a diversity receive module 432. The wireless communication device 430 is like the wireless communication device 400 of FIG. 16A, except that the wireless communication device 430 also includes diversity receive features. As illustrated in FIG. 16B, the wireless communication device 430 includes a diversity antenna 431, a diversity module 432 configured to process signals received by the diversity antenna 431 and including filters 433, and a transceiver 434 in communication with both the radio frequency front end 422 and the diversity receive module 432. The filters 433 can include one or more SAW resonators or packages that include any suitable combination of features discussed with reference to any embodiments discussed above.

Although embodiments disclosed herein relate to surface acoustic wave resonators or packages, any suitable principles and advantages disclosed herein can be applied to other types of acoustic wave resonators that include an IDT electrode, such as Lamb wave resonators and/or boundary wave resonators. For example, any suitable combination of features of the tilted and rotated IDT electrodes disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of making an acoustic wave device comprising:

forming or providing a substrate with a substrate outer edge;

forming or providing a functional layer over a first portion of the substrate, the functional layer ending with a first tapered outer edge spaced a first distance inward from the substrate outer edge so that a second portion of the substrate is not covered by the functional layer;

forming or providing a piezoelectric layer over a first portion of the functional layer, the piezoelectric layer ending with a second tapered outer edge spaced a second distance inward from the substrate outer edge so that a second portion of the functional layer is not covered by the piezoelectric layer, a bottom of the second tapered outer edge aligned with a top of the first tapered outer edge to reduce an acoustic reflection magnitude at the second tapered outer edge; and forming or providing an interdigital transducer electrode over a portion of the piezoelectric layer.

2. The method of claim 1 wherein the second distance is greater than the first distance.

3. The method of claim 1 wherein the first and second tapered outer edges are aligned and extend in a plane along an angle of the first and second tapered outer edges.

4. The method of claim 1 wherein an angle of the first and second tapered outer edges is between 45 degrees and 80 degrees.

5. The method of claim 1 further comprising forming or providing a polyimide layer over the second tapered outer edge of the piezoelectric layer and over at least a portion of the substrate.

6. The method of claim 1 wherein the functional layer includes silicon dioxide (SiO2).

7. The method of claim 1 wherein the piezoelectric layer includes one or more of lithium tantalate, lithium niobate.

8. The method of claim 1 wherein the substrate includes one of silicon, poly-silicon, amorphous silicon, silicon nitride (SiN), Sapphire, quartz, aluminum nitride (AlN) or polycrystalline ceramic ($Mg_2O_4$).

9. The method of claim 1 wherein the first tapered outer edge has a first angle and the second tapered outer edge has a second angle that is the same as the first angle.

10. The method of claim 1 wherein the first tapered outer edge has a first angle and the second tapered outer edge has a second angle that is different than the first angle.

11. A method of making a radio frequency module comprising:

forming or providing a package substrate;

forming or providing an acoustic wave device including forming or providing a substrate with a substrate outer edge, forming or providing a functional layer over a first portion of the substrate, functional layer ending with a first tapered outer edge spaced a first distance inward from the substrate outer edge so that a second portion of the substrate is not covered by the functional layer, forming or providing a piezoelectric layer over at least a portion of the functional layer, the piezoelectric layer ending with a second tapered outer edge spaced a second distance inward from the substrate outer edge so that a second portion of the functional layer is not covered by the piezoelectric layer, a bottom of the second tapered outer edge aligned with a top of the first tapered outer edge to reduce an acoustic reflection magnitude at the second tapered outer edge of the piezoelectric layer, and forming or providing an interdigital transducer electrode over a portion of the piezoelectric layer; and attaching additional circuitry and the acoustic wave device to the package substrate.

12. The method of claim 11 wherein the second distance is greater than the first distance.

13. The method of claim 11 wherein the first and second tapered outer edges are aligned and extend in a plane along an angle of the first and second tapered outer edges.

14. The method of claim 11 wherein an angle of the first and second tapered outer edges is between 45 degrees and 80 degrees.

15. The method of claim 11 further comprising forming or providing a polyimide layer over the second tapered outer edge of the piezoelectric layer and over at least a portion of the substrate.

16. The method of claim 11 wherein the functional layer includes silicon dioxide (SiO2).

17. The method of claim 11 wherein the piezoelectric layer includes one or more of lithium tantalate, lithium niobate.

18. The method of claim 11 wherein the substrate includes one of silicon, poly-silicon, amorphous silicon, silicon nitride (SiN), Sapphire, quartz, aluminum nitride (AlN) or polycrystalline ceramic ($Mg_2O_4$).

19. The method of claim 11 wherein the first tapered outer edge has a first angle and the second tapered outer edge has a second angle that is the same as the first angle.

20. The method of claim 11 wherein the first tapered outer edge has a first angle and the second tapered outer edge has a second angle that is different than the first angle.

* * * * *